US012581786B2

(12) United States Patent
Kim

(10) Patent No.: US 12,581,786 B2
(45) Date of Patent: Mar. 17, 2026

(54) DISPLAY DEVICE AND MANUFACTURING METHOD OF THE SAME

(71) Applicant: Samsung Display Co., LTD., Yongin-si (KR)

(72) Inventor: Ki Bum Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 419 days.

(21) Appl. No.: 18/358,842

(22) Filed: Jul. 25, 2023

(65) Prior Publication Data

US 2024/0145524 A1 May 2, 2024

(30) Foreign Application Priority Data

Oct. 28, 2022 (KR) ........................ 10-2022-0141246

(51) Int. Cl.
| | |
|---|---|
| *H01L 27/15* | (2006.01) |
| *H01L 33/24* | (2010.01) |
| *H01L 33/44* | (2010.01) |
| *H01L 33/50* | (2010.01) |
| *H01L 33/60* | (2010.01) |
| *H10H 20/821* | (2025.01) |
| *H10H 20/84* | (2025.01) |
| *H10H 20/851* | (2025.01) |
| *H10H 20/856* | (2025.01) |
| *H10H 29/14* | (2025.01) |
| *H10H 20/01* | (2025.01) |
| *H10H 20/80* | (2025.01) |

(52) U.S. Cl.
CPC ........ *H10H 29/142* (2025.01); *H10H 20/821* (2025.01); *H10H 20/84* (2025.01); *H10H 20/8515* (2025.01); *H10H 20/856* (2025.01); *H10H 20/0363* (2025.01); *H10H 20/882* (2025.01)

(58) Field of Classification Search
CPC .... H10H 29/142; H10H 20/821; H10H 20/84; H10H 20/8515; H10H 20/856
See application file for complete search history.

(56) References Cited

U.S. PATENT DOCUMENTS

| | | | |
|---|---|---|---|
| 8,541,792 B2 * | 9/2013 | Thomsen | .............. C03C 17/245 438/30 |
| 10,606,121 B2 * | 3/2020 | Takeya | ................ H01L 25/0753 |

(Continued)

FOREIGN PATENT DOCUMENTS

KR 10-2023-0172680 A 12/2023

*Primary Examiner* — Tracie Y Green
(74) *Attorney, Agent, or Firm* — Womble Bond Dickinson (US) LLP

(57) ABSTRACT

A display device includes: a first substrate; a thin film transistor on the first substrate; a via insulation layer on the thin film transistor; a light emitting element on the via insulating layer and having first and second ends with different polarities from each other; a first capping portion on the first end of the light emitting element and forming a first closed space; a second capping portion spaced apart from the first capping portion, on the second end of the light emitting element, and forming a second closed space; and a reflective layer covering the first capping portion and the second capping portion. The light emitting element, the first capping portion, and the second capping portion do not overlap the thin film transistor in a thickness direction.

20 Claims, 19 Drawing Sheets

(56)         References Cited

U.S. PATENT DOCUMENTS

2017/0012097 A1*   1/2017  Choi ..................... H10K 59/131
2020/0013766 A1*   1/2020  Kim ....................... H01L 25/167
2023/0361259 A1*  11/2023  Yun ....................... H01L 25/167

* cited by examiner

NDA

1

DA

DR3

DR1

DR2

SPXn: SPX1, SPX2, SPX3

RME: RME1, RME2
CNE: CNE1, CNE2

FIG. 6

RME: RME1, RME2
CNE: CNE1, CNE2
ED: EDa, EDb
DM1: DM1a, DM1b
DM2: DM2a, DM2b
QDL: WCP, BSL, SCP

RME1

RME2

PAS1

VIA

PVX

ILD

BL

SUB1

X2

X2'

RME: RME1, RME2

DR2

DR1

DR3

RME: RME1, RME2

RME: RME1, RME2
CNE: CNE1, CNE2
ED: EDa, EDb
DM1: DM1a, DM1b
DM2: DM2a, DM2b

RME: RME1, RME2
CNE: CNE1, CNE2
ED: EDa, EDb
DM1: DM1a, DM1b
DM2: DM2a, DM2b
QDL: WCP, BSL, SCP

RME: RME1, RME2
CNE: CNE1, CNE2
ED: EDa, EDb
DM1_2: DM1a_2, DM1b_2
DM2_2: DM2a_2, DM2b_2
QDL: WCP, BSL, SCP

1_3

CNE1
DM1a_3
DL1
DM1b_3
DM2b
DL2
DM2a
PAS2
RL
h1
h2
CNE2
PAS3
PAS1
RME1
EDa
EDb
RME2
VIA
PVX
ILD
BL
SUB1
QDL
SUB2
WCP   SCP   BSL

X2                                                                X2'

RME: RME1, RME2
CNE: CNE1, CNE2
ED: EDa, EDb
DM1_3: DM1a_3, DM1b_3
DM2: DM2a, DM2b
QDL: WCP, BSL, SCP

DISPLAY DEVICE AND MANUFACTURING METHOD OF THE SAME

CROSS-REFERENCE TO RELATED APPLICATION

This application claims priority to and the benefit of Korean Patent Application No. 10-2022-0141246, filed on Oct. 28, 2022, in the Korean Intellectual Property Office, the entire content of which is incorporated herein by reference.

BACKGROUND

1. Field

Aspects of embodiments of the present disclosure relate to a display device and a manufacturing method of the same.

2. Description of the Related Art

The importance of display devices has steadily increased with the development of multimedia technology. In response thereto, various types of display devices, such as an organic light emitting diode (OLED) display, a liquid crystal display (LCD), and the like, have been used.

A display device is a device for displaying an image and includes a display panel, such as an organic light emitting display panel or a liquid crystal display panel. The light emitting display panel may include light emitting elements, such as light emitting diodes (LED). Examples of the light emitting diode include an organic light emitting diode (OLED), which uses an organic material as a fluorescent material, and an inorganic light emitting diode, which uses an inorganic material as a fluorescent material.

An inorganic light emitting diode using an inorganic semiconductor as a fluorescent material remains durable even in a high temperature environment and has higher efficiency of blue light emission than an organic light emitting diode.

SUMMARY

Embodiments of the present disclosure provide a display device with improved light output efficiency of a light emitting element.

Embodiments of the present disclosure also provide a method of manufacturing a display device with improved light output efficiency of a light emitting element.

However, aspects and features of the present disclosure are not limited to those set forth herein. The above and other aspects and features of the present disclosure will become more apparent to one of ordinary skill in the art to which the present disclosure pertains by referencing the detailed description of the present disclosure given below.

According to an embodiment of the present disclosure, a display device includes: a first substrate; a thin film transistor on the first substrate; a via insulation layer on the thin film transistor; a light emitting element on the via insulating layer and having first and second ends with different polarities from each other; a first capping portion on the first end of the light emitting element and forming a first closed space; a second capping portion spaced apart from the first capping portion, on the second end of the light emitting element, and forming a second closed space; and a reflective layer covering the first capping portion and the second capping portion. The light emitting element, the first capping portion, and the second capping portion do not overlap the thin film transistor in a thickness direction.

The display device may further include an anchor portion between the light emitting element and the reflective layer and exposing the first and second ends of the light emitting element, and the anchor portion may be between the first capping portion and the second capping portion.

The display device may further include a first insulating layer covering the first capping portion, the second capping portion, and the anchor portion, and the reflective layer may be on the first insulating layer.

The display device may further include: a first connection electrode in contact with the first end of the light emitting element and electrically connected to the thin film transistor; and a second connection electrode in contact with the second end of the light emitting element and spaced apart from the first connection electrode. The first capping portion may be on the first connection electrode, and the second capping portion may be on the second connection electrode.

At least a portion of the first connection electrode may be exposed in a separation space between the first capping portion and the anchor portion and may be in contact with the first insulating layer, and at least a portion of the second connection electrode may be exposed in a separation space between the second capping portion and the anchor portion and may be in contact with the first insulating layer.

The display device may further include a first insulating layer covering the first capping portion and the second capping portion. The first insulating layer may be in contact with a portion of the light emitting element exposed by a separation space between the first capping portion and the second capping portion, and the reflective layer may be on the first insulating layer.

Each of the first capping portion and the second capping portion may have a semi-elliptical shape or a dome shape, and the reflective layer may be curved along outer surfaces of the first capping portion and the second capping portion.

The first capping portion may have a varying inclination orientation with respect to a first reference line, and the second capping portion may have a varying inclination orientation with respect to a second reference line. The first reference line may be outside the first end of the light emitting element, and the second reference line may be outside the second end of the light emitting element.

The first capping portion may include: a first portion on one side of the first reference line and having a decreasing inclination in a direction toward the light emitting element; and a second portion on another side of the first reference line and having an increasing inclination in a direction toward the light emitting element. The second capping portion may include: a first portion on one side of the second reference line and having a decreasing inclination in a direction toward the light emitting element; and a second portion on another side of the second reference line and having an increasing inclination in a direction toward the light emitting element.

The second portion of the first capping portion may be closer to the light emitting element than the first portion of the first capping portion is, and the second portion of the second capping portion may be closer to the light emitting element than the first portion of the second capping portion is.

The light emitting element may include: a first semiconductor layer; an active layer on the first semiconductor layer; and a second semiconductor layer on the active layer. The active layer may be closer to the first end of the light emitting element than the second end of the light emitting element, and a volume of the first capping portion may be greater than a volume of the second capping portion.

According to an embodiment of the present disclosure, a display device includes: a first substrate; a via insulation layer on a top surface of the first substrate; a light emitting element on the via insulating layer and having first and second ends with different polarities from each other; a first capping portion on the first end of the light emitting element and forming a first closed space; a second capping portion spaced apart from the first capping portion, on the second end of the light emitting element, and forming a second closed space; a reflective layer covering the first capping portion and the second capping portion; and a color conversion element layer on a bottom surface of the first substrate.

Light emitted from the light emitting element may be reflected by the reflective layer and passes through the color conversion element layer.

The color conversion element layer may include: a base member; a scatterer in the base member; and/or a wavelength conversion material in the base member.

Each of the first capping portion and the second capping portion may have a semi-elliptical shape or a dome shape, and the reflective layer may be curved along outer surfaces of the first capping portion and the second capping portion.

The first capping portion may have a varying inclination orientation with respect to a first reference line, and the second capping portion may have a varying inclination orientation with respect to a second reference line. The first reference line may be outside the first end of the light emitting element, and the second reference line may be outside the second end of the light emitting element.

The first capping portion may include: a first portion on one side of the first reference line and having a decreasing inclination in a direction toward the light emitting element; and a second portion on the other side of the first reference line and having an increasing inclination in a direction toward the light emitting element. The second capping portion may include: a first portion on one side of the second reference line and having a decreasing inclination in a direction toward the light emitting element; and a second portion on the other side of the second reference line and having an increasing inclination in a direction toward the light emitting element.

The second portion of the first capping portion may be closer to the light emitting element than the first portion of the first capping portion is, and the second portion of the second capping portion may be closer to the light emitting element than the first portion of the second capping portion is.

The display device may further include an anchor portion between the light emitting element and the reflective layer and exposing the first and second ends of the light emitting element, and the anchor portion may be between the first capping portion and the second capping portion.

The display device may further include a first insulating layer covering the first capping portion, the second capping portion, and the anchor portion, and the reflective layer may be on the first insulating layer.

According to an embodiment of the present disclosure, a manufacturing method of a display device is provided. The method includes: forming a first alignment electrode and a second alignment electrode spaced apart from each other on a first substrate; arranging a light emitting element in a separation space between the first alignment electrode and the second alignment electrode, the light emitting element having first and second ends with different polarities from each other; forming a connection electrode layer on the light emitting element; forming, on the connection electrode layer, a first capping portion overlapping the first end of the light emitting element and having a first closed space and a second capping portion overlapping the second end of the light emitting element and having a second closed space; forming a first connection electrode in contact with the first end of the light emitting element and a second connection electrode in contact with the second end of the light emitting element by etching the connection electrode layer exposed by the first capping portion and the second capping portion by using the first capping portion and the second capping portion as an etch stop layer; and forming a reflective layer on the first capping portion and the second capping portion.

Each of the first capping portion and the second capping portion may have a semi-elliptical shape or a dome shape, and the reflective layer may be curved along outer surfaces of the first capping portion and the second capping portion.

However, aspects and features of the present disclosure, and embodiments thereof, are not limited to those described above and various other aspects, features, and embodiments are incorporated herein.

BRIEF DESCRIPTION OF THE DRAWINGS

The above and other aspects and features of the present disclosure will become more apparent by describing, in detail, embodiments thereof with reference to the attached drawings, in which:

FIG. 6 is an enlarged view of the area A1 in FIG. 4;

FIG. 9 is an enlarged view illustrating a light output structure of a display device according to one embodiment;

DETAILED DESCRIPTION

Figure 1:
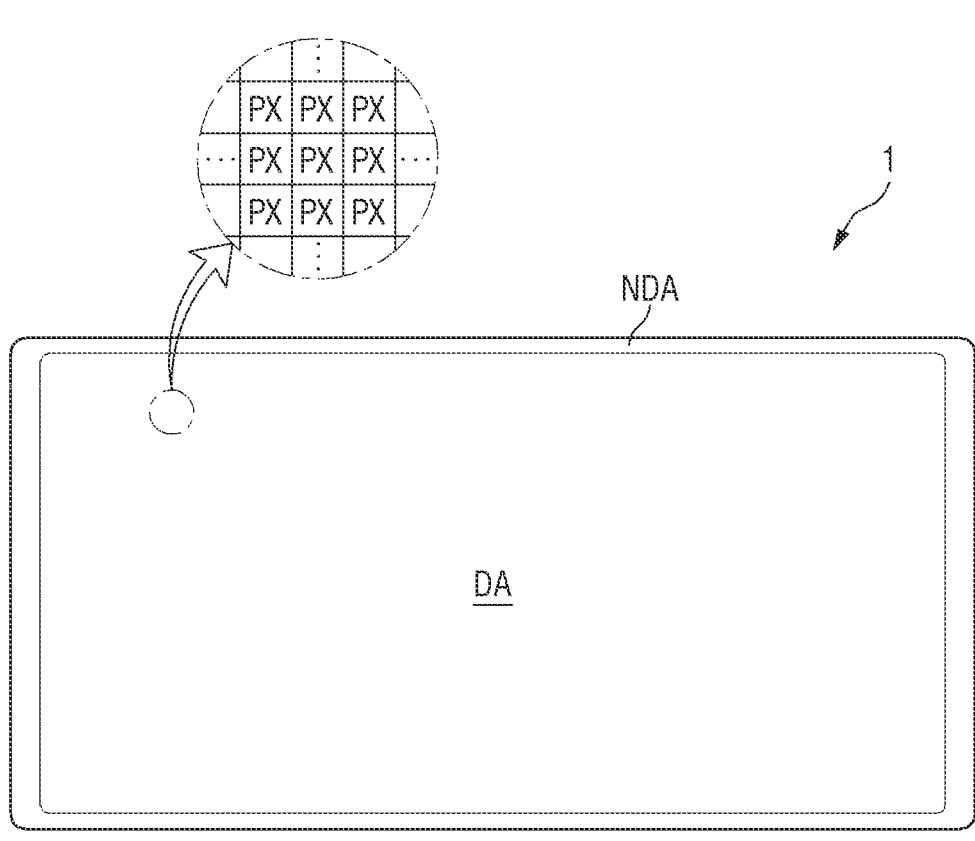
FIG. 1 is a schematic plan view of a display device according to one embodiment.
Figure 1:
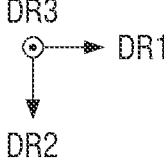

The present disclosure will now be described more fully hereinafter with reference to the accompanying drawings, in which embodiments of the present disclosure are shown. The present disclosure may, however, be embodied in different forms and should not be construed as limited to the embodiments described herein. Rather, these embodiments are provided so that this disclosure will be thorough and complete and will fully convey the scope of the present disclosure to those skilled in the art.

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

In the figures, dimensions of the various elements, layers, etc. may be exaggerated for clarity of illustration. The same reference numerals designate the same elements. As used herein, the term "and/or" includes any and all combinations of one or more of the associated listed items. Further, the use of "may" when describing embodiments of the present disclosure relates to "one or more embodiments of the present disclosure." Expressions, such as "at least one of" and "any one of," when preceding a list of elements, modify the entire list of elements and do not modify the individual elements of the list. For example, the expression "at least one of a, b, or c" indicates only a, only b, only c, both a and b, both a and c, both b and c, all of a, b, and c, or variations thereof. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

It will be understood that, although the terms first, second, third, etc. may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section without departing from the teachings of example embodiments.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

The terminology used herein is for the purpose of describing embodiments of the present disclosure and is not intended to be limiting of the present disclosure. As used herein, the singular forms "a" and "an" are intended to include the plural forms as well, unless the context clearly indicates otherwise. It will be further understood that the terms "includes," "including," "comprises," and/or "comprising," when used in this specification, specify the presence of stated features, integers, steps, operations, elements, and/or components but do not preclude the presence or addition of one or more other features, integers, steps, operations, elements, components, and/or groups thereof.

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Each of the features of the various embodiments of the present disclosure may be combined or combined with each other, in part or in whole, and technically various interlocking and driving are possible. Each embodiment may be implemented independently of each other or may be implemented together in an association.

Hereinafter, embodiments of the present disclosure will be described with reference to the accompanying drawings.

FIG. 1 is a schematic plan view of a display device according to one embodiment.

A first direction DR1, a second direction DR2, and a third direction DR3 are defined as shown in FIG. 1. The first direction DR1 and the second direction DR2 may be perpendicular to each other, the first direction DR1 and the third direction DR3 may be perpendicular to each other, and the second direction DR2 and the third direction DR3 may be perpendicular to each other. It may be understood that the first direction DR1 refers to a horizontal direction in the drawing, the second direction DR2 refers to a vertical direction in the drawing, and the third direction DR3 refers to an upward and downward direction (i.e., a thickness direction or into the page direction) in the drawing.

In the following specification, unless otherwise stated, "direction" may refer to both of directions extending along the direction. Further, when both "directions" extending to opposite sides are to be distinguished, one side will be referred to as "one side in the direction" and the other side will be referred to as "the other side in the direction." Referring to FIG. 1, a direction in which an arrow indicating a direction is directed (or points) is referred to as one side, and an opposite direction thereto is referred to as the other side. It should be understood, however, that a direction mentioned in an embodiment refers to a relative direction and the embodiment is not limited to the direction mentioned.

In addition, for simplicity of description, when referring to a display device 1 or the surfaces of each member constituting the display device 1, one surface facing one side in the direction in which the image is displayed (e.g., the third direction DR3) is referred to as a front surface, and the opposite surface of the one surface is referred to as a rear surface.

Referring to FIG. 1, a display device 1 according to one embodiment is configured to display a moving image and/or a still image. The display device 1 may refer to (or may embody) any electronic device including a display screen. Examples of the display device 1 may include a television, a laptop computer, a monitor, a billboard, an Internet-of-Things (IoT) device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder, and the like, which include a display screen.

The display device 1 includes a display panel which provides a display screen. Examples of the display panel may include an inorganic light emitting diode display panel, an organic light emitting display panel, a quantum dot light emitting display panel, a plasma display panel, and a field emission display panel. In the following description, an embodiment in which an inorganic light emitting diode display panel is applied as a display panel will be described, but the present disclosure is not limited thereto, and other display panels may be applied within the same scope of technical spirit.

The shape of the display device 1 may be variously modified. For example, the display device 1 may have a shape such as a rectangular shape elongated in a horizontal direction, a rectangular shape elongated in a vertical direction, a square shape, a quadrilateral shape with rounded corners (e.g., vertices), other polygonal shapes, and a circular shape. The shape of a display area DA of the display device 1 may also be similar to (or may correspond to) the overall shape of the display device 1. FIG. 1 illustrates an embodiment in which the display device 1 has a rectangular shape elongated in a first direction DR1.

The display device 1 may have the display area DA and a non-display area NDA. The display area DA is an area where an image can be displayed, and the non-display area NDA is an area where an image is not displayed. The display area DA may be referred to as an active region, and the non-display area NDA may be referred to as a non-active region. The display area DA may substantially occupy the center of the display device 1.

The display area DA may include a plurality of pixels PX. The plurality of pixels PX may be arranged in a matrix. The shape of each pixel PX may be a rectangular or square shape in a plan view. However, the present disclosure is not limited thereto, and each pixel PX may have a rhombic shape in which each side is inclined with respect to one direction. The pixels PX may be arranged in a stripe type or an island type. In addition, each of the pixels PX may include one or more light emitting elements that emit light of a specific wavelength band to display a specific color.

The non-display area NDA may be disposed around the display area DA. The non-display area NDA may completely or partially surround (e.g., may completely or partially surround in a plan view or extend around the entire or partial periphery of) the display area DA. The display area DA may have a rectangular shape, and in such an embodiment, the non-display area NDA may be disposed adjacent to four sides of the display area DA. The non-display area NDA may form a bezel of the display device 1. Wires or circuit drivers included in the display device 1 may be disposed in the non-display area NDA or external devices may be mounted thereon.

Figure 2:
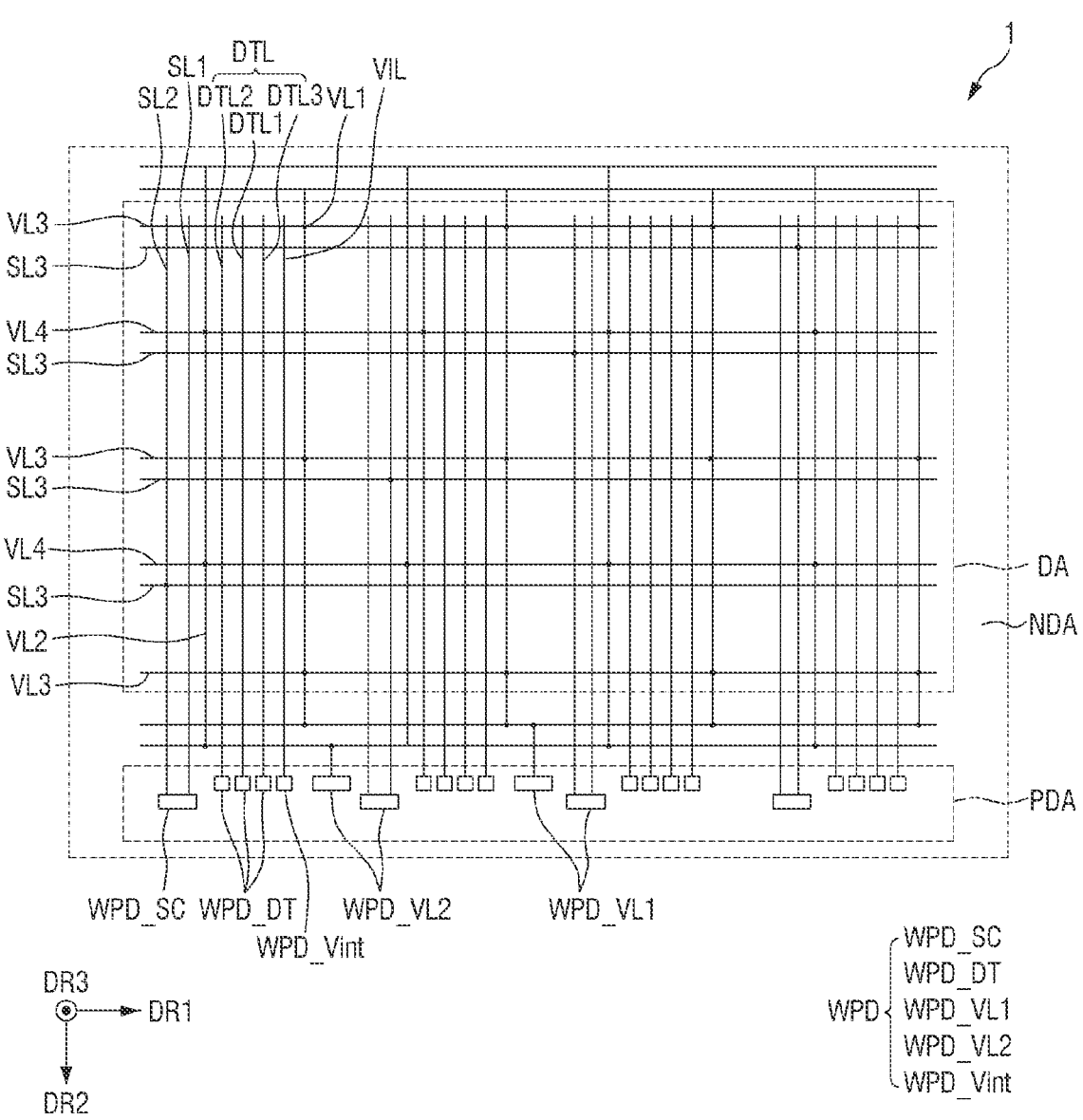
FIG. 2 is a schematic layout view illustrating a plurality of wires of a display device according to one embodiment.

FIG. 2 is a schematic layout view illustrating a plurality of wires of a display device according to one embodiment.

Referring to FIG. 2, the display device 1 may include a plurality of wires. The display device 1 may include a plurality of scan lines SL (e.g., SL1, SL2, and SL3), a plurality of data lines DTL (e.g., DTL1, DTL2, and DTL3), an initialization voltage line VIL, and a plurality of voltage lines VL (e.g., VL1, VL2, VL3, and VL4). Other wires may be provided in the display device 1. The plurality of wires may include wires formed of a first conductive layer and extending in a first direction DR1, and wires formed of a third conductive layer and extending in the second direction DR2. However, the extension directions of the wires are not limited thereto.

The first scan line SL1 and the second scan line SL2 may be disposed to extend in the second direction DR2. The first scan line SL1 and the second scan line SL2 may be disposed adjacent to each other and may be disposed to be spaced apart from the different first scan line SL1 and second scan line SL2 in the first direction DR1. The first scan line SL1 and the second scan line SL2 may be connected to a scan line pad WPD_SC connected to a scan driver. The first scan line SL1 and the second scan line SL2 may be disposed to extend from the pad area PDA disposed in the non-display area NDA to (e.g., into) the display area DA.

The third scan line SL3 may be disposed to extend in the first direction DR1 and may be disposed to be spaced apart from another third scan line SL3 in the second direction DR2. One third scan line SL3 may be connected to one or more first scan lines SL1 or one or more second scan lines SL2. The plurality of scan lines SL may form a mesh structure in (or over) the entire surface of the display area DA, but the present disclosure is not limited thereto.

The term "connected" as used herein may mean not only that one member is connected to another member through physical contact but may also mean that one member is connected to another member through yet another member. This may also be understood as one part and the other part as integral elements are connected into an integrated element via another element. Furthermore, if one element is connected to another element, this may be construed as including electrical connection via another element in addition to a direct connection based on physical contact.

The data lines DTL may be disposed to extend in the second direction DR2. The data line DTL includes a first data line DTL1, a second data line DTL2, and a third data line DTL3, and each one of the first to third data lines DTL1, DTL2, and DTL3 forms a group and is disposed adjacent to each other. Each of the data lines DTL1, DTL2, and DTL3 may be disposed to extend from the pad area PDA disposed in the non-display area NDA to (e.g., into) the display area DA. However, the present disclosure is not limited thereto, and the plurality of data lines DTL may be spaced apart from each other at equal intervals between a first voltage line VL1 and a second voltage line VL2, to be described later.

The initialization voltage line VIL may be disposed to extend in the second direction DR2. The initialization voltage line VIL may be disposed between the data lines DTL and the first voltage line VL1. The initialization voltage line VIL may be disposed to extend from the pad area PDA disposed in the non-display area NDA to (e.g., into) the display area DA.

The first voltage line VL1 and the second voltage line VL2 are disposed to extend in the second direction DR2, and the third voltage line VL3 and the fourth voltage line VL4 are disposed to extend in the first direction DR1. The first voltage line VL1 and the second voltage line VL2 may be alternately disposed in the first direction DR1, and the third voltage line VL3 and the fourth voltage line VL4 may be alternately disposed in the second direction DR2. The first voltage line VL1 and the second voltage line VL2 may be disposed to extend in the second direction DR2 to cross the display area DA, and some of the third voltage line VL3 and the fourth voltage line VL4 may be disposed in the display area DA and others thereof may be disposed in the non-display area NDA positioned at both sides of the display area DA in the first direction DR1, respectively. The first voltage line VL1 and the second voltage line VL2 may be formed of the first conductive layer, and the third voltage line VL3 and the fourth voltage line VL4 may be formed of the third conductive layer disposed on a layer different from the first conductive layer. The first voltage line VL1 may be connected to at least one third voltage line VL3, the second voltage line VL2 may be connected to at least one fourth voltage line VL4, and the plurality of voltage lines VL may form a mesh structure in (e.g., over) the entire display area DA. However, the present disclosure is not limited thereto.

The first scan line SL1, the second scan line SL2, the data line DTL, the initialization voltage line VIL, the first voltage line VL1, and the second voltage line VL2 may be electrically connected to at least one line pad WPD. Each line pad WPD may be disposed in the non-display area NDA. In one embodiment, each of the line pads WPD may be disposed in the pad area PDA positioned on the lower side, which is the one side of the display area DA in the second direction DR2. The first scan line SL1 and the second scan line SL2 are connected to the scan line pad WPD_SC disposed in the pad area PDA, and the plurality of data lines DTL are connected to different ones of the data line pads WPD_DT, respectively. The initialization voltage line VIL is connected to an initialization line pad WPD_Vint, the first voltage line VL1 is connected to a first voltage line pad WPD_VL1, and the second voltage line VL2 is connected to a second voltage line pad WPD_VL2. The external devices may be mounted on the line pads WPD. The external devices may be mounted on the line pads WPD by using an anisotropic conductive film, ultrasonic bonding, or the like. In the illustrated embodiment, each of the line pads WPD is disposed on the pad area PDA disposed on the lower side of the display area DA, but the present disclosure is not limited thereto. Some of the plurality of line pads WPD may be disposed in any one area on the upper side or on the left and right sides of the display area DA.

Each pixel PX or sub-pixel SPXn (n being an integer of 1 to 3) of the display device 1 includes a pixel driving circuit. The above-described wirings may pass through each pixel PX or in the vicinity thereof to apply a driving signal to each pixel driving circuit. The pixel driving circuit may include transistors and capacitors. The number of the transistors and the capacitors of each pixel driving circuit may be variously modified. According to one embodiment, in each sub-pixel SPXn of the display device 1, the pixel driving circuit may have a 3T1C structure including three transistors and one capacitor. Hereinafter, the pixel driving circuit having the 3T1C structure will be described as an example, but the present disclosure is not limited thereto, and various other modified circuits or structures, such as a 2T1C structure, a 7T1C structure, and a 6T1C structure, may be applied.

Figure 3:
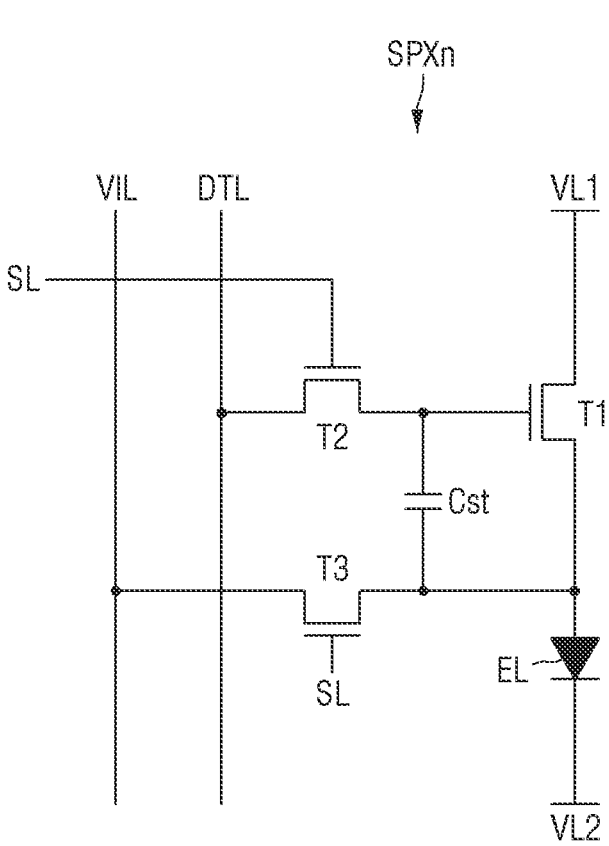
FIG. 3 is an equivalent circuit diagram of a sub-pixel according to one embodiment.

FIG. 3 is an equivalent circuit diagram of a sub-pixel according to one embodiment.

Referring to FIG. 3, each sub-pixel SPXn of the display device 1 according to one embodiment includes three transistors T1, T2, and T3 and one storage capacitor Cst in addition to a light emitting diode EL.

The light emitting diode EL emits light by (or according to) a current supplied through a first thin film transistor T1. The light emitting diode EL includes a first electrode, a second electrode, and at least one light emitting element disposed between them. The light emitting element may emit light of a specific wavelength band by electrical signals transmitted from the first electrode and the second electrode.

One end of the light emitting diode EL may be connected to the source electrode of the first thin film transistor T1, and the other end thereof may be connected to the second voltage line VL2 to which a low potential voltage (hereinafter, a second power voltage) lower than a high potential voltage (hereinafter, a first power voltage) of the first voltage line VL1 is supplied.

The first thin film transistor T1 adjusts a current flowing from the first voltage line VL1, to which the first power voltage is supplied, to the light emitting diode EL according to the voltage difference between the gate electrode and the source electrode. For example, the first thin film transistor T1 may be a driving transistor for driving the light emitting diode EL. The gate electrode of the first thin film transistor T1 may be connected to the source electrode of the second thin film transistor T2, the source electrode of the first thin film transistor T1 may be connected to the first electrode of the light emitting diode EL, and the drain electrode of the first thin film transistor T1 may be connected to the first voltage line VL1 to which the first power voltage is applied.

The second thin film transistor T2 is turned on by a scan signal of the scan line SL to connect the data line DTL to the gate electrode of the first thin film transistor T1. The gate electrode of the second thin film transistor T2 may be connected to the scan line SL, the source electrode thereof may be connected to the gate electrode of the first thin film transistor T1, and the drain electrode thereof may be connected to the data line DTL.

The third transistor T3 is turned on by a scan signal of the scan line SL to connect the initialization voltage line VIL to one end of the light emitting diode EL. The gate electrode of the third transistor T3 may be connected to the scan line SL, the drain electrode thereof may be connected to the initialization voltage line VIL, and the source electrode thereof may be connected to one end of the light emitting diode EL or to the source electrode of the first thin film transistor T1.

In one embodiment, the source electrode and the drain electrode of each of the transistors T1, T2, and T3 are not limited to those described above and may be reversed. Each of the transistors T1, T2, and T3 may be formed of a thin film transistor. In FIG. 3, each of the transistors T1, T2, and T3 is described as being formed of an N-type metal oxide semiconductor field effect transistor (MOSFET), but the present disclosure is not limited thereto. For example, each of the transistors T1, T2, and T3 may be formed of a P-type MOSFET. In other embodiments, some of the transistors T1, T2, and T3 may be formed of an N-type MOSFET and the others thereof may be formed of a P-type MOSFET.

The storage capacitor Cst is formed between the gate electrode and the source electrode of the first thin film transistor T1. The storage capacitor Cst stores a difference voltage between a gate voltage and a source voltage of the first thin film transistor T1.

In the embodiment shown in FIG. 3, the gate electrode of the second thin film transistor T2 may be connected to a scan line SL1, and the gate electrode of the third transistor T3 may be connected to a scan line SL2. In other words, the second thin film transistor T2 and the third transistor T3 may be turned on in response to a scan signal applied from the same scan line. However, the present disclosure is not limited thereto, and the second thin film transistor T2 and the third transistor T3 may be connected to different scan lines to be turned on in response to scan signals applied from different scan lines.

Hereinafter, a structure of the pixel PX of the display device 1 according to one embodiment will be described.

Figure 4:
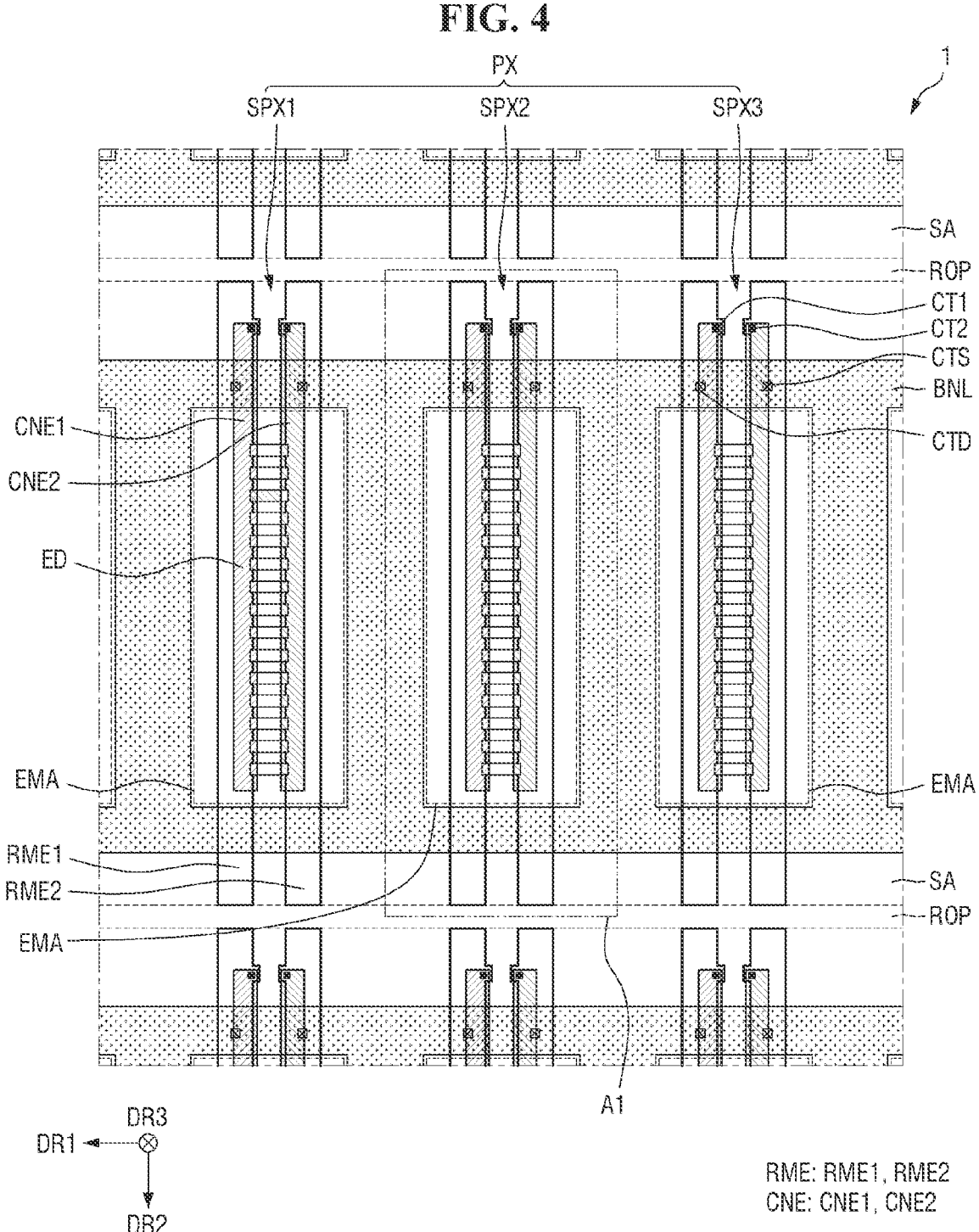
FIG. 4 is a plan view illustrating a structure of a pixel of a display device according to one embodiment.
Figure 5:
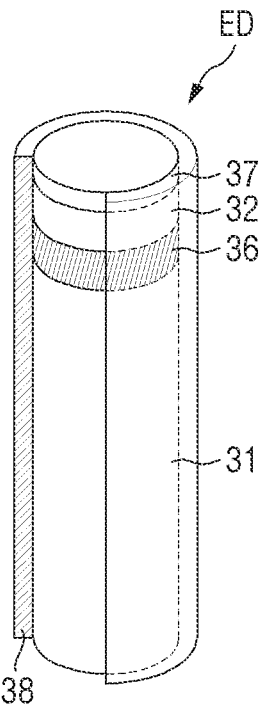
FIG. 5 is a perspective view illustrating the structure of the light emitting element shown in FIG. 4.
Figure 6:
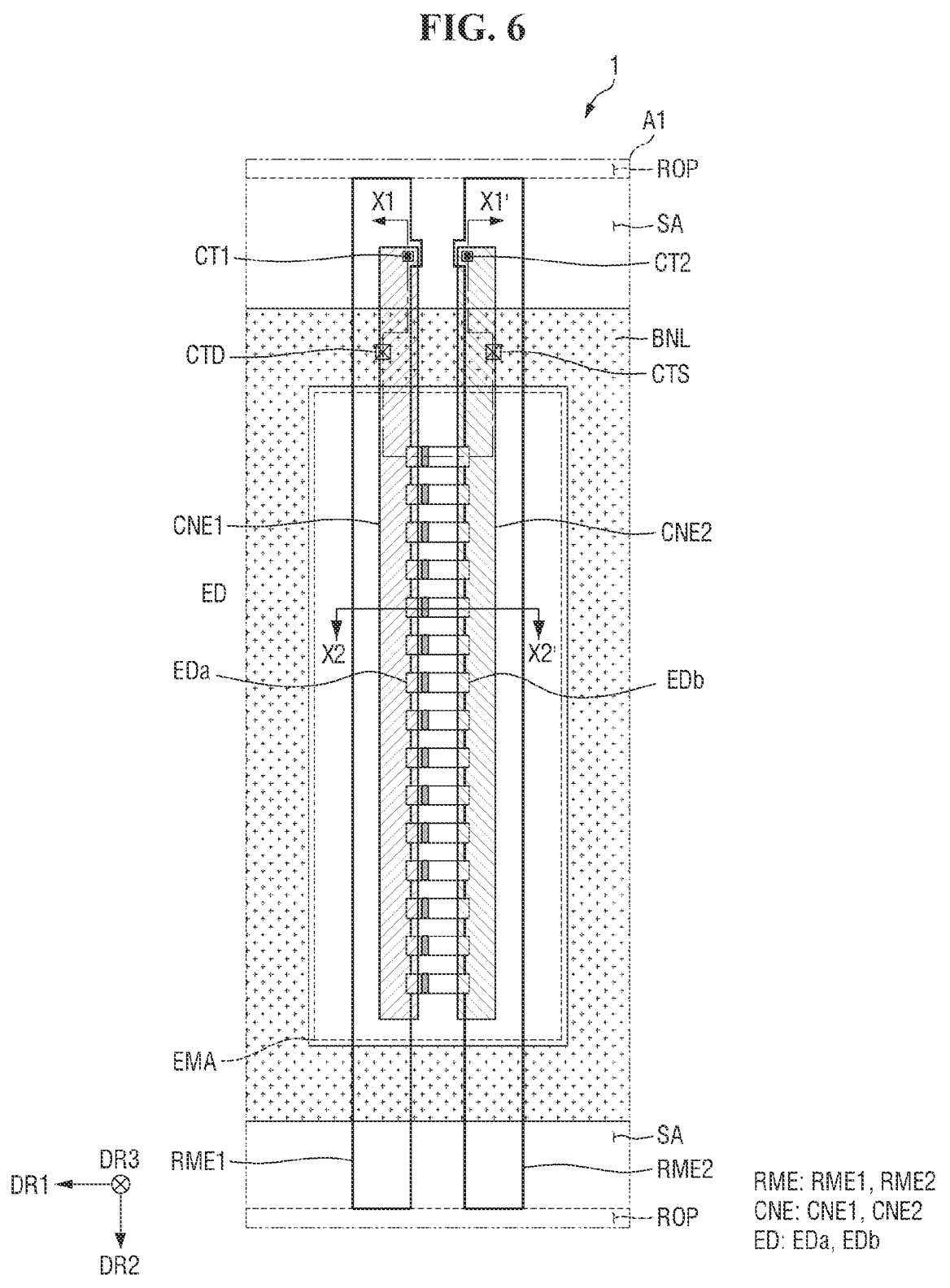

FIG. 4 is a plan view illustrating a structure of a pixel of a display device according to one embodiment. FIG. 5 is a perspective view illustrating the structure of the light emitting element shown in FIG. 4. FIG. 6 is an enlarged view of the area A1 in FIG. 4.

Referring to FIGS. 4 and 6, each of the pixels PX in the display device 1 may include a plurality of sub-pixels SPXn. For example, one pixel PX may include a first sub-pixel SPX1, a second sub-pixel SPX2, and a third sub-pixel SPX3. Although the illustrated embodiment shows one pixel PX including three sub-pixels SPXn, the present disclosure is not limited thereto. In other embodiments, the pixel PX may include a greater number of sub-pixels SPXn. Hereinafter, for simplicity of description, an embodiment in which one pixel PX includes three sub-pixels SPXn will be primarily described.

The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. However, the present disclosure is not limited thereto, and the sub-pixels SPXn may emit light of the same color. In one embodiment, each of the sub-pixels SPXn may emit blue light. Hereinafter, for simplicity of description, an embodiment in which each sub-pixel SPXn emits blue light will be described.

The first sub-pixel SPX1, the second sub-pixel SPX2, and the third sub-pixel SPX3 may be sequentially arranged in the first direction DR1. For example, the first sub-pixel SPX1 may be disposed on the other side of the third sub-pixel SPX3 in the first direction DR1. Accordingly, one pixel PX and at least one sub-pixel SPXn of the sub-pixels SPXn of the one pixel PX may be adjacent to at least one sub-pixel SPXn of the sub-pixels SPXn of the pixel PX adjacent to the one pixel PX.

Each sub-pixel SPXn of the display device 1 may have an emission area EMA and a non-emission area. The emission area EMA may be an area in which the light emitting element ED is disposed to emit light of a specific wavelength band.

The non-emission area may be a region in which the light emitting element ED is not disposed and a region from which light is not emitted because light emitted from the light emitting element ED does not reach there. Circuit elements for driving each sub-pixel SPXn may be disposed in the non-emission area.

The emission area EMA may be defined by the external bank BNL. For example, the emission area EMA may be a space (or an area) surrounded by (e.g., surrounded in a plan view by) the external bank BNL. In some embodiments, the emission area EMA may have a rectangular shape with a short side in the first direction DR1 and a long side in the second direction DR2, but the present disclosure is not limited thereto.

The emission area EMA may include the region in which the light emitting element ED is disposed and a region adjacent to the light emitting element ED from where the light emitted from the light emitting element ED is emitted. For example, the emission area EMA may further include a region in which the light emitted from the light emitting element ED is reflected or refracted by another member and emitted. The plurality of light emitting elements ED may be disposed in the respective sub-pixels SPXn, and the emission area EMA may include an area at where the light emitting elements EDs are disposed and an area adjacent thereto.

Although in the illustrated embodiment the sub-pixels SPXn have emission areas EMA that are substantially identical in size, the present disclosure is not limited thereto. In some embodiments, the emission areas EMA of the sub-pixels SPXn may have different sizes according to a color or wavelength band of light to be emitted from the light emitting element ED disposed in each sub-pixel SPXn.

Each sub-pixel SPXn may also have a sub-region SA disposed in the non-emission area. The sub-region SA may be a divided area according to the disposition of an alignment electrode RME. The sub-region SA may be disposed on one side and the other side of the emission area EMA in the second direction DR2. The emission areas EMA may be alternately arranged in the first direction DR1, and the sub-region SA may extend in the first direction DR1. Each of a plurality of emission areas EMA and the sub-regions SA may be repeatedly disposed (e.g., alternatingly disposed or arranged) in the second direction DR2. Each of the plurality of emission areas EMA may be disposed between the sub-regions SA.

The sub-region SA may be a region shared by the sub-pixels SPXn adjacent to each other in the first direction DR1. For example, the first sub-pixel SPX1, the second sub-pixel SPX2, and the third sub-pixel SPX3 may share the same sub-region SA. In addition, the sub-region SA may be a region shared by the sub-pixels SPXn adjacent to each other in the second direction DR2. For example, the sub-regions SA disposed on both sides of the external bank BNL in the second direction DR2 illustrated in FIG. 4 may be shared by the sub-pixel SPXn illustrated in the drawing and the sub-pixels SPXn adjacent to each other in the second direction DR2 and not illustrated in the drawing.

Light may not be emitted from the sub-region SA because the light emitting element ED is not disposed in the sub-region SA, but the alignment electrode RME disposed in each sub-pixel SPXn may be partially disposed in the sub-region SA. The alignment electrode RME disposed in different sub-pixels SPXn may be disposed to be separated at a separation portion ROP of the sub-region SA.

The alignment electrode RME and the connection electrodes CNE are disposed in each sub-pixel SPXn in a shape extending in the second direction DR2.

The alignment electrode RME may include a first alignment electrode RME1 and a second alignment electrode RME2 sequentially arranged in the first direction DR1 per one sub-pixel SPXn in the display area DA. The first alignment electrode RME1 and the second alignment electrode RME2 may be disposed to be spaced apart from each other in the first direction DR1.

The first alignment electrode RME1 may be disposed on one side of the emission area EMA in the first direction DR1. For example, the first alignment electrode RME1 may be disposed to be spaced apart in the first direction DR1 from a portion of the external bank BNL forming one side of the emission area EMA in the first direction DR1.

The first alignment electrode RME1 may have a shape extending in the second direction DR2. In some embodiments, the first alignment electrode RME1 may have a rectangular planar profile, but the present disclosure is not limited thereto. FIGS. 4 and 6 illustrate an embodiment in which the first alignment electrode RME1 has a rectangular planar profile.

The first alignment electrode RME1 may be electrically connected to a circuit element layer CCL (see, e.g., FIG. 7), to be described later, through a first electrode contact hole (e.g., a first electrode contact opening) CTD. The first alignment electrode RME1 may be applied with the above-described first power voltage through the first electrode contact hole CTD.

The second alignment electrode RME2 may be disposed on the other side of the first alignment electrode RME1 in the first direction DR1. The second alignment electrode RME2 may be disposed on the other side of the emission area EMA in the first direction DR1. For example, the second alignment electrode RME2 may be disposed to be spaced apart in the first direction DR1 from a portion of the external bank BNL forming the other side of the emission area EMA in the first direction DR1.

The second alignment electrode RME2 may have a shape extending in the second direction DR2. In some embodiments, the second alignment electrode RME2 may have a rectangular planar profile, but the present disclosure is not limited thereto. FIGS. 4 and 6 illustrate an embodiment in which the second alignment electrode RME2 has a rectangular planar profile.

The second alignment electrode RME2 may be electrically connected to the circuit element layer CCL (see, e.g., FIG. 7), to be described later, through a second electrode contact hole (e.g., a second electrode contact opening) CTS. The second alignment electrode RME2 may be applied with the above-described second power voltage through the second electrode contact hole CTS.

The first electrode contact hole CTD and the second electrode contact hole CTS may not overlap (e.g., may be offset from or outside of) the emission area EMA. In some embodiments, the first electrode contact hole CTD and the second electrode contact hole CTS may be disposed to overlap the external bank BNL, but the present disclosure is not limited thereto. For example, the first electrode contact hole CTD and the second electrode contact hole CTS may also be disposed on the sub-region SA. FIGS. 4 and 6 illustrate an embodiment in which the first electrode contact hole CTD and the second electrode contact hole CTS overlap the external bank BNL.

The plurality of alignment electrodes RME1 and RME2 may be spaced apart from each other in the first direction DR1 to provide (or form) a space (or area) in which the light emitting element ED is disposed. For example, the light emitting elements ED may be disposed in a separation space between the first alignment electrode RME1 and the second alignment electrode RME2.

Referring to FIG. 5, the light emitting element ED may be a light emitting diode. In one embodiment, the light emitting element ED may be an inorganic light emitting diode that has a nanometer or micrometer size and is made of an inorganic material. The light emitting element ED may be aligned between two electrodes having a polarity when an electric field is formed in a specific direction between two electrodes facing each other.

The light emitting element ED, according to one embodiment, may have a shape elongated in one direction. The light emitting element ED may have a shape of a cylinder, rod, wire, tube, or the like. However, the shape of the light emitting element ED is not limited thereto, and the light emitting element ED may have a polygonal prism shape, such as a regular cube, a rectangular parallelepiped, and a hexagonal prism, or may have various other shapes, such as a shape elongated in one direction and having a partially inclined outer surface.

The light emitting element ED may include a semiconductor layer doped with any conductivity type (e.g., p-type or n-type) dopant. The semiconductor layer may emit light of a specific wavelength band by receiving an electrical signal applied from an external power source. The light emitting element ED may include a first semiconductor layer 31, a second semiconductor layer 32, a light emitting layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \le x \le 1$, $0 \le y = 1$, $0 \le x+y \le 1$). For example, the first semiconductor layer 31 may be any one or more of AlGaInN, GaN, AlGaN, InGaN, AlN, and InN doped with an n-type dopant. The n-type dopant doped into the first semiconductor layer 31 may be Si, Ge, Sn, Se, or the like.

The second semiconductor layer 32 is disposed on the first semiconductor layer 31 with the light emitting layer 36 therebetween. The second semiconductor layer 32 may be a p-type semiconductor, and the second semiconductor layer 32 may include a semiconductor material having a chemical formula of $Al_xGa_yIn_{1-x-y}N$ ($0 \le x \le 1$, $0 \le y \le 1$, $0 \le x+y \le 1$). For example, the second semiconductor layer 32 may be any one or more of AlGaInN, GaN, AlGaN, InGaN, AlN, and InN doped with a p-type dopant. The p-type dopant doped into the second semiconductor layer 32 may be Mg, Zn, Ca, Ba, or the like.

Accordingly, both ends of the light emitting element ED may have different polarities. Hereinafter, for simplicity of description, with respect to both ends (e.g., opposite ends) of the light emitting element ED, one end of which that is adjacent to the second semiconductor layer 32 is referred to as a "first end" and the other end to which that is adjacent to the first semiconductor layer 31 is referred to as a "second end." The first end of the light emitting element ED may be positioned opposite to the second end.

The first end and the second end of the light emitting element ED may have different polarities. In addition, the first ends of the respective light emitting elements ED different from each other may have the same polarity, and the second ends of the respective light emitting elements ED different from each other may have the same polarity.

Although an embodiment in which the first semiconductor layer 31 and the second semiconductor layer 32 are configured as one layer is illustrated, the present disclosure is not limited thereto. For example, the first semiconductor layer 31 and the second semiconductor layer 32 may include a greater number of layers, such as a cladding layer or a tensile strain barrier reducing (TSBR) layer, depending on the material of the light emitting layer 36.

For example, the light emitting element ED may further include another semiconductor layer disposed between the first semiconductor layer 31 and the light emitting layer 36 or between the second semiconductor layer 32 and the light emitting layer 36. The semiconductor layer disposed between the first semiconductor layer 31 and the light emitting layer 36 may be one or more of AlGaInN, GaN, AlGaN, InGaN, AlN, InN, and SLs doped with an n-type dopant, and the semiconductor layer disposed between the second semiconductor layer 32 and the light emitting layer 36 may be one or more of AlGaInN, GaN, AlGaN, InGaN, AlN, and InN doped with a p-type dopant.

The light emitting layer 36 is disposed between the first semiconductor layer 31 and the second semiconductor layer 32. The light emitting layer 36 may include a material having a single or multiple quantum well structure. When the light emitting layer 36 includes a material having the multiple quantum well structure, a plurality of quantum layers and well layers may be alternately stacked. The light emitting layer 36 may emit light by coupling of electron-hole pairs according to an electrical signal applied through the first semiconductor layer 31 and the second semiconductor layer 32. The light emitting layer 36 may include a material such as AlGaN, AlGaInN, or InGaN. For example, when the light emitting layer 36 has the multiple quantum well structure in which quantum layers and well layers are alternately stacked, the quantum layer may include a material such as AlGaN or AlGaInN and the well layer may include a material such as GaN or AlInN.

The light emitting layer 36 may have a structure in which semiconductor materials having large band gap energy and semiconductor materials having small band gap energy are alternately stacked and may include other Group III to V semiconductor materials according to the wavelength band of the light to be emitted. The light to be emitted by the light emitting layer 36 is not limited to the light of the blue wavelength band, but the light emitting layer 36 may emit light of a red or green wavelength band in other embodiments.

The electrode layer 37 may be an ohmic connection electrode. However, the present disclosure is not limited thereto, and the electrode layer 37 may be a Schottky connection electrode. The light emitting element ED may include at least one electrode layer 37, but in other embodiments, the light emitting element ED may include one or more electrode layers 37. The present disclosure is not, however, limited thereto, and in some embodiments, the electrode layer 37 may be omitted.

In the display device 1, when the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), ITO, IZO, or ITZO. With the above-described configuration, both ends (e.g., the first end and the second end) of each of the light emitting elements ED may have different polarities.

The insulating film 38 is arranged to surround outer surfaces of the plurality of semiconductor layers and electrode layers described above. For example, the insulating film 38 may be disposed to surround at least the outer surface of the light emitting layer 36 and while exposing both ends of the light emitting element ED in the longitudinal direction. Further, in a cross-sectional view, the insulating film 38 may have a top surface, which is a curved or circular surface in a region adjacent to at least one end of the light emitting element ED.

The insulating film 38 may include at least one material having insulating properties, for example, silicon oxide ($SiO_x$), silicon nitride ($SiN_x$), silicon oxynitride ($SiO_xN_y$), aluminum nitride ($AlN_x$), aluminum oxide ($AlO_x$), zirconium oxide ($ZrO_x$), hafnium oxide ($HfO_x$), or titanium oxide ($TiO_x$). In the illustrated embodiment, the insulating film 38 is formed as a single layer, but the present disclosure is not limited thereto. In other embodiments, the insulating film 38 may be formed as a multilayer structure having a plurality of stacked layers.

The insulating film 38 may protect the semiconductor layers and the electrode layer of the light emitting element ED. The insulating film 38 may prevent an electrical short circuit from occurring in the light emitting layer 36 when an electrode to which an electrical signal is transmitted is in direct contact with the light emitting element ED. In addition, the insulating film 38 may prevent a decrease in luminous efficiency of the light emitting element ED.

Further, an outer surface of the insulating film 38 may be surface treated. The light emitting elements ED may be deposited (or aligned) by spraying an ink in which the light emitting elements ED are dispersed on the electrodes. In some embodiments, the surface (e.g., the outer surface) of the insulating film 38 may be treated to have a hydrophobic property or hydrophilic property to keep the light emitting elements ED in a dispersed state, that is, to keep the light emitting elements ED from aggregating with other adjacent light emitting elements ED in the ink.

Referring back to FIGS. 4 and 6, the plurality of light emitting elements ED may be arranged side by side in the second direction DR2 in a separation space between the first alignment electrode RME1 and the second alignment electrode RME2 within the emission area EMA of each subpixel SPXn.

The hatched portion shown in each of the plurality of light emitting elements ED in FIG. 6 may be the light emitting layer 36 illustrated in FIG. 5. In each of the plurality of light emitting elements ED, one end adjacent to the hatched portion may be the first end described above, and the opposite end may be the second end.

The light emitting element ED may extend in the first direction DR1 and may be oriented such that the first end is disposed on the first alignment electrode RME1 and the second end is disposed on the second alignment electrode RME2.

The connection electrode CNE may be disposed on the light emitting elements ED. The connection electrode CNE may include a first connection electrode CNE1 and a second connection electrode CNE2 that are sequentially arranged in the first direction DR1 while being spaced apart from each other.

The first connection electrode CNE1 and the second connection electrode CNE2 may be disposed to be spaced apart from each other in the first direction DR1. For example, the second connection electrode CNE2 may be disposed to the other side of the first connection electrode CNE1 in the first direction DR1.

The first connection electrode CNE1 may be disposed on the first alignment electrode RME1 in the emission area EMA. The first connection electrode CNE1 may have a shape extending substantially in the second direction DR2 in the emission area EMA.

The first connection electrode CNE1 may be in contact with the first end of the light emitting element ED in the emission area EMA. For example, the first connection electrode CNE1 may extend in the second direction DR2 in the emission area EMA and may be in contact with the first ends of the light emitting elements ED, which are arranged side by side in the second direction DR2 in a separation space between the first alignment electrode RME1 and the second alignment electrode RME2.

The first connection electrode CNE1 may be electrically connected to the first alignment electrode RME1 through a first contact portion CT1 in a region that does not overlap the emission area EMA. Accordingly, the first connection electrode CNE1 may be supplied with the above-described first power voltage through the first alignment electrode RME1.

The second connection electrode CNE2 may be disposed on the second alignment electrode RME2 in the emission area EMA. The second connection electrode CNE2 may have a shape substantially extending in the second direction DR2 in the emission area EMA.

The second connection electrode CNE2 may be in contact with the second end of the light emitting element ED in the emission area EMA. For example, the second connection electrode CNE2 may extend in the second direction DR2 in the emission area EMA and may be in contact with the second ends of the light emitting elements ED, which are arranged side by side in the second direction DR2 in a separation space between the first alignment electrode RME1 and the second alignment electrode RME2.

The second connection electrode CNE2 may be electrically connected to the second alignment electrode RME2 through a second contact portion CT2 in a region that does not overlap the emission area EMA. Accordingly, the second connection electrode CNE2 may be supplied with the above-described second power voltage through the second alignment electrode RME2.

Hereinafter, a stacked structure of elements in the display device 1 according to one embodiment will be described.

Figure 7:
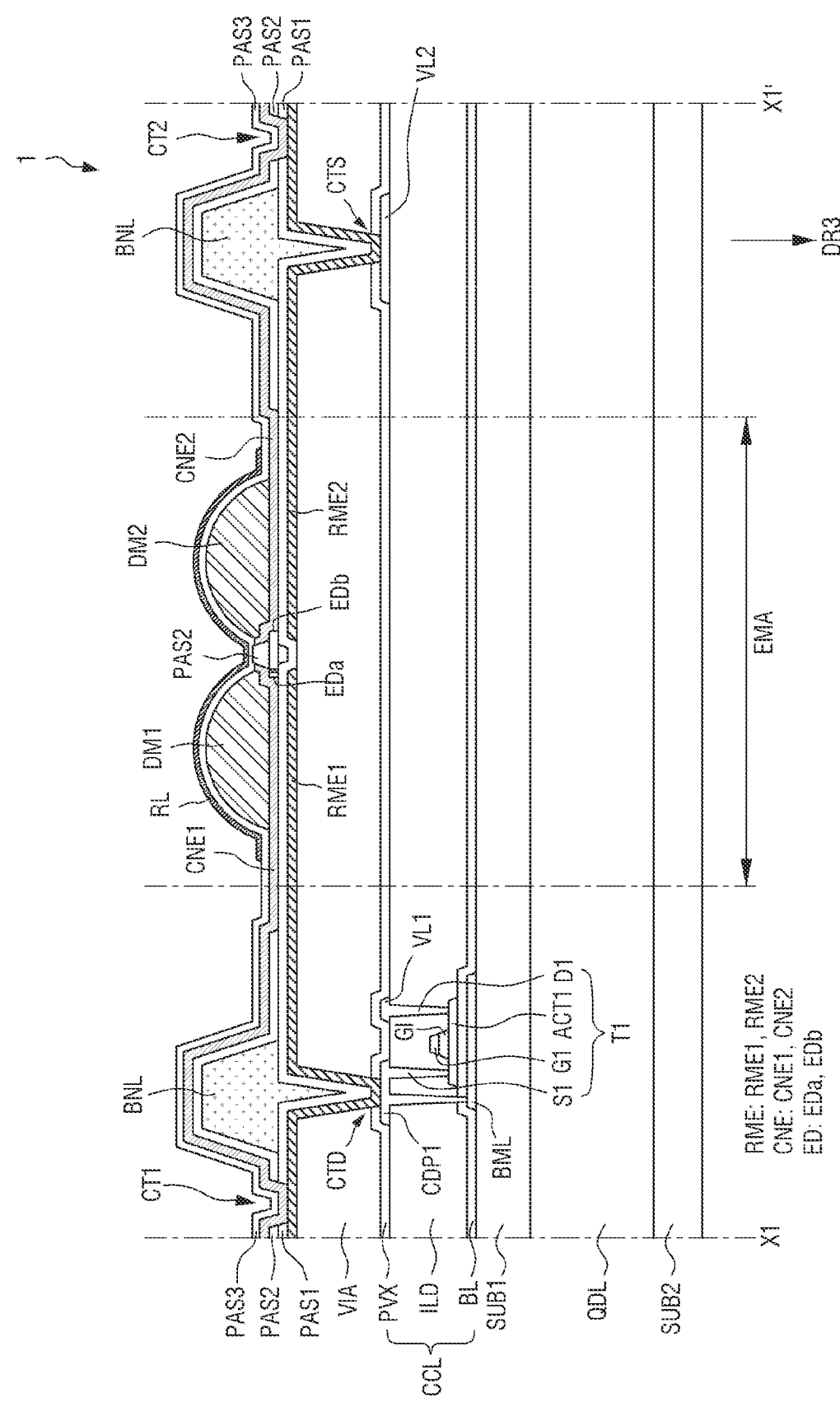
FIG. 7 is a cross-sectional view taken along the line X1-X1' in FIG. 6.
Figure 8:
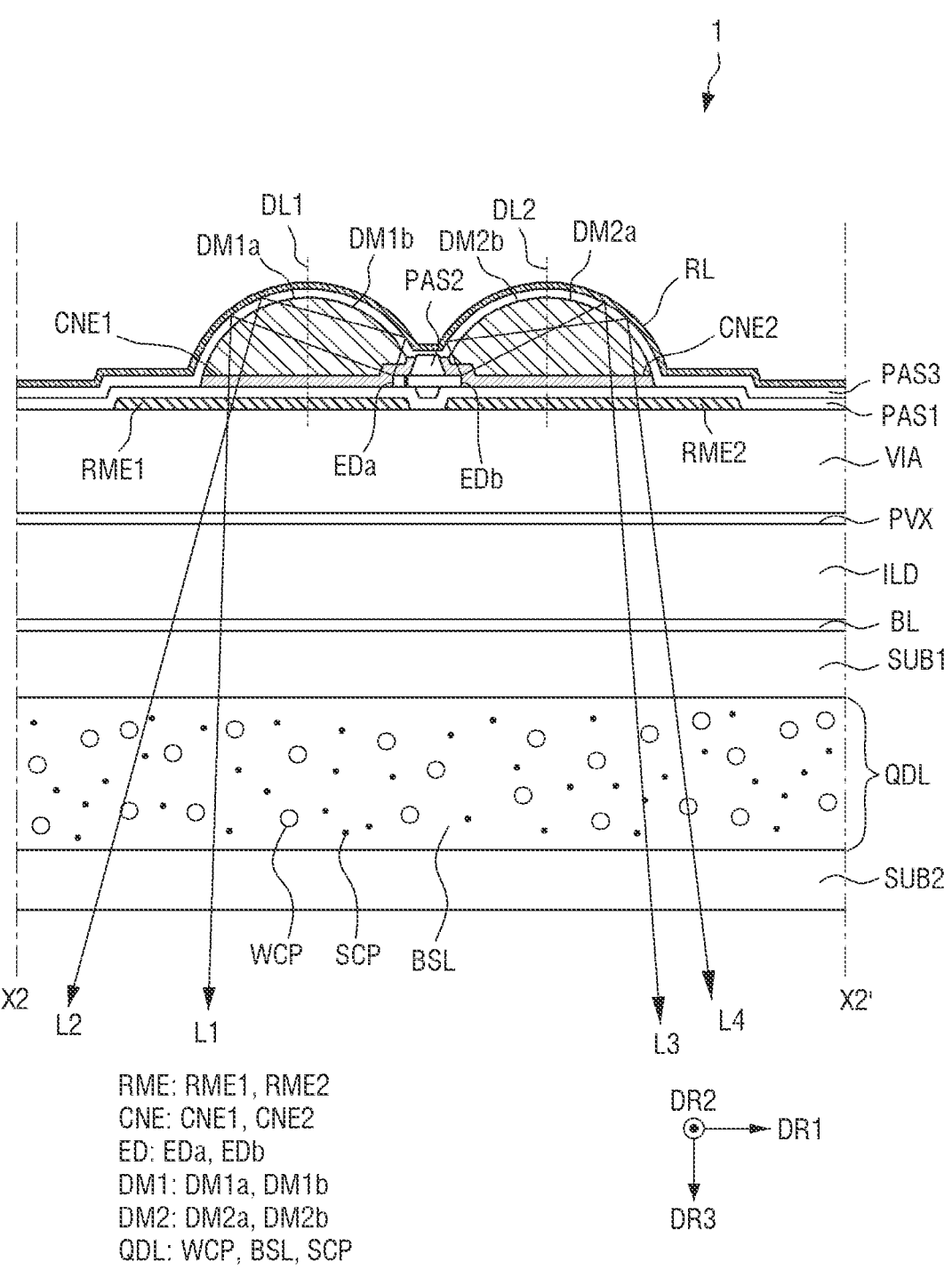
FIG. 8 is a cross-sectional view taken along the line X2-X2' in FIG. 6.

FIG. 7 is a cross-sectional view taken along the line X1-X1' in FIG. 6. FIG. 8 is a cross-sectional view taken along the line X2-X2' in FIG. 6.

Although FIG. 7 only illustrates the first thin film transistor T1, the present disclosure is not limited thereto, and a greater number of transistors may be included.

Referring to FIGS. 7 and 8 in conjunction with FIG. 6, the display device 1 according to one embodiment may include a first substrate SUB1. The display device 1 may further include a color conversion element layer QDL, and a second substrate SUB2 disposed on one surface of the first substrate SUB1 in the third direction DR3 and may also include a semiconductor layer, a plurality of conductive layers, and a plurality of insulating layers disposed on the other surface of the first substrate SUB1 in the third direction DR3.

In addition, as described above, the display device 1 may include the alignment electrode RME, the light emitting element ED, and the connection electrode CNE. Each of the semiconductor layer, the conductive layer, and the insulating layer may constitute a circuit element layer CCL of the display device 1.

The first substrate SUB1 and the second substrate SUB2 may be made of an insulating material, such as glass, quartz, polymer resin, or the like. Further, the first substrate SUB1 and the second substrate SUB2 may be rigid substrates, but the present disclosure is not limited thereto. In other embodiments, the first substrate SUB1 and the second substrate SUB2 may be flexible substrates that can be bent, folded, or rolled.

The first substrate SUB1 may be disposed above the other surface of the second substrate SUB2 in the third direction DR3, and they may face each other. The color conversion element layer QDL may be disposed between the first substrate SUB1 and the second substrate SUB2.

The color conversion element layer QDL may scatter light emitted from the light emitting element ED or may convert the wavelength of the emitted light into another wavelength. The color conversion element layer QDL may include, for example, a base portion BSL, and a wavelength conversion material WCP and a scatterer SCP dispersed in the base portion BSL.

The base portion BSL of the color conversion element layer QDL may act as a base of the color conversion element layer QDL. The base portion BSL may include (or may contain) a light-transmissive organic material. For example, the base portion BSL may include an epoxy resin, an acrylic resin, a cardo resin, or an imide resin.

The wavelength conversion material WCP of the color conversion element layer QDL may convert blue light emitted from the light emitting element ED into red light or green light. The wavelength conversion material WCP may be a quantum dot, a quantum rod, a phosphor, or the like. Examples of the quantum dot may include a Group IV nanocrystal, a Group II-VI compound nanocrystal, a Group III-V compound nanocrystal, a Group IV-VI nanocrystal, and a combination thereof. When one sub-pixel emits blue light, the wavelength conversion material WCP may be omitted.

The scatterer SCP of the color conversion element layer QDL may scatter light emitted from the light emitting element ED. The scatterer SCP may be a metal oxide particle or an organic particle. Examples of the metal oxide may include titanium oxide (e.g., $TiO_2$), zirconium oxide (e.g., $ZrO_2$), aluminum oxide (e.g., $Al_2O_3$), indium oxide (e.g., $In_2O_3$), zinc oxide (ZnO), tin oxide (e.g., $SnO_2$), and the like. Examples of a material of the organic particles may include an acrylic resin, an urethane resin, and the like.

The display device 1, according to one embodiment, is a bottom emission type display, in which light emitted from the light emitting element ED is reflected from a reflective layer RL, to be described later, and is emitted toward the rear surface of the display device 1 (e.g., toward one side thereof in the third direction DR3). A detailed description of the path of light emitted from the light emitting element ED will be given later.

The circuit element layer CCL may be disposed on the other surface of the first substrate SUB1 in the third direction DR3. In the circuit element layer CCL, various wires that transmit electrical signals to the light emitting element ED disposed above the first substrate SUB1 may be disposed. The circuit element layer CCL may include a first conductive layer, a semiconductor layer, a second conductive layer, a third conductive layer, and the like as a plurality of conductive layers as illustrated in FIG. 7. The circuit element layer CCL may also include a buffer layer BL, a first gate insulating layer GI, an interlayer insulating layer ILD, a passivation layer PVX, and the like as a plurality of insulating layers.

A first conductive layer may be disposed on the first substrate SUB1. The first conductive layer includes a lower metal layer BML that is disposed to overlap a first semiconductor layer ACT1 of the first thin film transistor T1. The lower metal layer BML may prevent light from entering the first semiconductor layer ACT1 of the first thin film transistor T1 or may be electrically connected to the first semiconductor layer ACT1 to stabilize electrical characteristics of the first thin film transistor T1. However, in other embodiments, the lower metal layer BML may be omitted.

The buffer layer BL may be disposed on the lower metal layer BML and the first substrate SUB1. The buffer layer BL may be formed on the first substrate SUB1 to protect the transistors of the pixel PX from moisture permeating through the first substrate SUB1, which may be susceptible to moisture permeation, and may planarize a surface (e.g., may provide a planar surface).

The semiconductor layer is disposed on the buffer layer BL. The semiconductor layer may include, for example, the first semiconductor layer ACT1 of the first thin film transistor T1. The first semiconductor layer ACT1 may be arranged to partially overlap a first gate electrode G1 of the second conductive layer, to be described later.

The semiconductor layer may include polycrystalline silicon, monocrystalline silicon, oxide semiconductor, and the like. In another embodiment, the semiconductor layer may include polycrystalline silicon. The oxide semiconductor may be an oxide semiconductor including (or containing) indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), or indium gallium zinc tin oxide (IG-ZTO).

A first gate insulating layer GI is disposed on the semiconductor layer in the display area DA. The first gate insulating layer GI may act as a gate insulating layer of each transistor. Although the first gate insulating layer GI is illustrated as being patterned together with the gate electrode G1 of the second conductive layer, to be described later, and as being partially disposed between the second conductive layer and the first semiconductor layer ACT1 of the semiconductor layer, the present disclosure is not limited thereto. In some embodiments, the first gate insulating layer GI may be entirely disposed on the buffer layer BL.

The second conductive layer is disposed on the first gate insulating layer GI. The second conductive layer may include, for example, the first gate electrode G1 of the first thin film transistor T1. The first gate electrode G1 may be arranged to overlap the channel region of the first semiconductor layer ACT1 in the third direction DR3, which is the thickness direction.

The interlayer insulating layer ILD may be disposed on the second conductive layer. The interlayer insulating layer ILD may act as an insulating film between the second conductive layer and other layers disposed thereon and may protect the second conductive layer.

The third conductive layer is disposed on the interlayer insulating layer ILD. The third conductive layer may include a metal. In some embodiments, the third conductive layer may include at least one metal selected from the group consisting of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu), but the present disclosure is not limited thereto.

The third conductive layer may include the first voltage line VL1 and the second voltage line VL2, a first conductive pattern CDP1, and a source electrode S1 and a drain electrode D1 of the first thin film transistor T1 that are disposed in the display area DA. As described above, the transistors for driving the pixel PX may be disposed so as not to overlap (e.g., to be offset from or outside of) the emission area EMA in the third direction DR3. Accordingly, because transistors are not disposed in the path of light reflected from the reflective layer RL, to be described later, light output efficiency may be improved.

The first voltage line VL1 may be applied with a high potential voltage (or the first power voltage) transmitted to the first alignment electrode RME1, and the second voltage line VL2 may be applied with a low potential voltage (or the second power voltage) transmitted to the second alignment electrode RME2. The first voltage line VL1 may be in partial contact with the first semiconductor layer ACT1 of the first thin film transistor T1 through a contact hole (e.g., a contact opening) that penetrates the interlayer insulating layer ILD. The first voltage line VL1 may act as a first drain electrode D1 of the first thin film transistor T1. The first voltage line VL1 may be directly connected to the first alignment electrode RME1, and the second voltage line VL2 may be directly connected to the second alignment electrode RME2.

The first conductive pattern CDP1 may be in contact with the first semiconductor layer ACT1 of the first thin film transistor T1 through the contact hole penetrating the interlayer insulating layer ILD. The first conductive pattern CDP1 may be in contact with the lower metal layer BML through another contact hole penetrating the interlayer insulating layer ILD and the buffer layer BL. The first conductive pattern CDP1 may act as a first source electrode S1 of the first thin film transistor T1. Further, the first conductive pattern CDP1 may be connected to the first electrode RME1 or the first connection electrode CNE1, to be described later. The first thin film transistor T1 may transmit the first power voltage applied from the first voltage line VL1 to the first electrode RME1 or the first connection electrode CNE1.

The passivation layer PVX is disposed on the third conductive layer. The passivation layer PVX may act as an insulating layer between the third conductive layer and other layers and may protect the third conductive layer.

The passivation layer PVX may have openings that expose the first conductive pattern CDP1 and the second voltage line VL2. For example, the passivation layer PVX may have the first electrode contact hole CTD exposing the first conductive pattern CDP1 and the second electrode contact hole CTS exposing the second voltage line VL2.

The buffer layer BL, the first gate insulating layer GI, the interlayer insulating layer ILD, and the passivation layer PVX, described above, may be formed (e.g., may each be formed) of a plurality of inorganic layers stacked in an alternating manner. For example, the buffer layer BL, the first gate insulating layer GI, the interlayer insulating layer ILD, and the passivation layer PVX may be formed (e.g., may each be formed) as a double layer formed by stacking or as a multilayer structure formed by alternately stacking inorganic layers including at least one of silicon oxide ($SiO_x$), silicon nitride ($SiN_x$), or silicon oxynitride ($SiO_xN_y$).

The via insulating layer VIA may be disposed on the circuit element layer CCL in the display area DA. For example, the via insulating layer VIA may be disposed on the passivation layer PVX of the circuit element layer CCL in the display area DA.

The via insulating layer VIA may include an organic insulating material, for example, an organic insulating material, such as polyimide, and may have a flat top surface by compensating for a height difference due to various wires inside the circuit element layer.

The alignment electrode RME may be disposed on the via insulating layer VIA in the display area DA. The alignment electrode RME may include the first alignment electrode RME1 and the second alignment electrode RME2 spaced apart from each other in the first direction DR1.

The first alignment electrode RME1 may be disposed on the via insulating layer VIA and may extend in a direction toward the second alignment electrode RME2. The second alignment electrode RME2 may be disposed on the via insulating layer VIA and may extend in a direction toward the first alignment electrode RME1.

The first alignment electrode RME1 may be in contact with the first conductive pattern CDP1 through the first electrode contact hole CTD, which penetrates (e.g., extends through) the first insulating layer PAS1, the via insulating layer VIA, and the passivation layer PVX. The second alignment electrode RME2 may be in contact with the second voltage line VL2 through the second electrode contact hole CTS, which penetrates (e.g., extends through) the via insulating layer VIA and the passivation layer PVX.

The alignment electrode RME may include a transparent conductive material. For example, the alignment electrode RME may include ITO, IZO, ITZO, or the like. Accordingly, the light emitted from the light emitting element ED may pass through the alignment electrode RME to be emitted in a direction toward the first substrate SUB1 (e.g., to one side thereof in the third direction DR3).

The first insulating layer PAS1 may be disposed in the entire display area DA and may be disposed on the alignment electrodes RME. The first insulating layer PAS1 may include an insulating material to protect the alignment electrodes RME and insulate the alignment electrodes RME from each other. In addition, the first insulating layer PAS1 may prevent the light emitting element ED disposed thereon from being damaged by direct contact with other members.

In an embodiment, a portion of the top surface of the first insulating layer PAS1 may be recessed at a separation space between the alignment electrodes RME1 and RME2 at where they are spaced apart from each other to form a stepped portion. The light emitting element ED may be disposed on the top surface of the first insulating layer PAS1 at where the stepped portions are formed and, thus, a space may remain between the light emitting element ED and the first insulating layer PAS1.

The first insulating layer PAS1 may have the contact portions (e.g., contact openings or contact holes) CT1 and CT2 in the display area DA. The contact portions may be disposed to overlap different alignment electrodes RME1 and RME2, respectively. For example, the contact portions may include the first contact portion CT1 disposed to overlap the first alignment electrode RME1 and the second contact portion CT2 disposed to overlap the second alignment electrode RME2.

In the display area DA, the first contact portion CT1 and the second contact portion CT2 may penetrate (e.g., may extend through) the first insulating layer PAS1 to partially expose the top surface of the first alignment electrode RME1 or the second alignment electrode RME2 thereunder.

Each of the first contact portion CT1 and the second contact portion CT2 may also penetrate some of the other insulating layers disposed on the first insulating layer PAS1. The alignment electrodes RME1 and RME2 exposed by the contact portions may be in contact with the connection electrode CNE. The light emitting elements ED may be electrically connected to the circuit element layer CCL, which is under the alignment electrodes RME1 and RME2 and the via insulating layer VIA, by contact with the connection electrodes CNE, thereby emitting light of a specific wavelength band by being applied with an electrical signal.

The external bank BNL may be disposed on the first insulating layer PAS1. The external bank BNL may have portions extending in the first direction DR1 and the second direction DR2 and may surround (e.g., may surround in a plan view or may extend around a periphery of) the sub-pixels SPXn. The external bank BNL may surround and divide each sub-pixel SPXn and may surround the outermost portion of the display area DA and may divide the display area DA and the non-display area NDA.

The external bank BNL may have a height (e.g., a predetermined height). Accordingly, the external bank BNL may effectively prevent ink from overflowing into the adjacent sub-pixels SPXn during the inkjet printing process during the manufacturing process of the display device 1. The external bank BNL may include an organic insulating material made of a transparent material, such as polyimide, but it is not limited thereto. For example, the external bank BNL may also include (or contain) a colored dye, such as a black pigment.

The second insulating layer PAS2 may be disposed on the plurality of light emitting elements ED, the first insulating layer PAS1, and the external bank BNL. The second insulating layer PAS2 includes a pattern portion disposed on the plurality of light emitting elements ED. The pattern portion is disposed to partially surround the outer surface of the light emitting element ED and may not cover both sides or both ends of the light emitting element ED. The pattern portion may form a linear or island-like pattern in each sub-pixel SPXn in a plan view. The pattern portion of the second insulating layer PAS2 may protect the light emitting element ED and may fix the light emitting elements ED during a manufacturing process of the display device 1. Further, the second insulating layer PAS2 may be disposed to fill the space between the light emitting element ED and the first insulating layer PAS1 thereunder. The pattern portion of the second insulating layer PAS2 may be referred to as an anchor portion.

The second insulating layer PAS2 may have the contact portions CT1 and CT2 in the display area DA (e.g., the contact portions CT1 and CT2 may also penetrate or extend through the second insulating layer PAS2). The contact portions may be disposed to overlap different alignment electrodes RME, respectively. For example, the contact portions may include the first contact portion CT1 disposed to overlap the first alignment electrode RME1 and the second contact portion CT2 disposed to overlap the second alignment electrode RME2. The first contact portion CT1 and the second contact portion CT2 may penetrate the second insulating layer PAS2 to partially expose the top surface of the first alignment electrode RME1 or the second alignment electrode RME2 thereunder. Each of the first contact portion CT1 and the second contact portion CT2 may further penetrate some of the other insulating layers disposed on the second insulating layer PAS2. The alignment electrode RME exposed by each of the contact portions may be in contact with the connection electrode CNE. The light emitting elements ED may be electrically connected to the circuit element layers CCL, which are under the alignment electrode RME and the via insulating layer VIA, via contact with the connection electrodes CNE, thereby emitting light of a specific wavelength band according to a received an electrical signal.

The connection electrode CNE may be disposed on the second insulating layer PAS2. The first connection electrode CNE1 may partially overlap the first alignment electrode RME1 in the emission area EMA and may be in contact with a first end EDa of the light emitting element ED. Similarly, the second connection electrode CNE2 may partially overlap the second alignment electrode RME2 in the emission area EMA and may be in contact with a second end EDb of the light emitting element ED.

As illustrated in FIG. 7, the first connection electrode CNE1 may be disposed to extend from the emission area EMA over the external bank BNL. The first connection electrode CNE1 may be in contact with the first alignment electrode RME1 through the first contact portion CT1, which penetrates the first insulating layer PAS1 and the second insulating layer PAS2. Accordingly, the first connection electrode CNE1 may be electrically connected to the first transistor T1 to be applied with the first power voltage.

As illustrated in FIG. 7, the second connection electrode CNE2 may be disposed to extend from the emission area EMA over the external bank BNL. The second connection electrode CNE2 may be in contact with the second alignment electrode RME2 through the second contact portion CT2, which penetrates the first insulating layer PAS1 and the second insulating layer PAS2. Accordingly, the second connection electrode CNE2 may be electrically connected to the second power line VL2 to be applied with the second power voltage.

The first connection electrode CNE1 and the second connection electrode CNE2 may be spaced apart from each other with the pattern portion of the second insulating layer PAS2 therebetween. For example, the first connection electrode CNE1 and the second connection electrode CNE2 may be insulated from each other by the pattern portion of the second insulating layer PAS2.

The connection electrodes CNE may include a conductive material. For example, they may include ITO, IZO, ITZO, aluminum (Al), or the like. As an example, the connection electrodes CNE may include a transparent conductive material, and light emitted from the light emitting element ED may pass through the connection electrodes CNE to be emitted.

Capping portions DM1 and DM2 are disposed on the connection electrode CNE. In some embodiments, the capping portions DM1 and DM2 may provide (or may form) a closed space in the form of a semi-ellipse or a dome similar thereto, but the shape of the capping portions DM1 and DM2 is not limited thereto as long as it provides a closed space for blocking the path of light emitted from the light emitting element ED and reflecting it to one side of the third direction DR3. FIGS. 7 and 8 illustrate that the capping portions DM1 and DM2 have a semi-elliptical shape or a dome shape similar thereto as one embodiment.

The capping portions DM1 and DM2 may cover both ends (e.g., opposite ends) of the light emitting element ED, respectively. For example, the first capping portion DM1 may be disposed on the first connection electrode CNE1 to form a first closed space that covers the first end EDa of the light emitting element ED, and the second capping portion DM2 may be disposed on the second connection electrode CNE2 to form a second closed space that covers the second end EDb of the light emitting element ED. The first capping portion DM1 and the second capping portion DM2 may be spaced apart from each other with the pattern portion of the second insulating layer PAS2 therebetween.

The shape of the first closed space formed by the first capping portion DM1 may be the same as the shape of the first capping portion DM1, and the shape of the second closed space formed by the second capping portion DM2 may be the same as the shape of the second capping portion DM2. In some embodiments, the shape of the first capping portion DM1 and the shape of the second capping portion DM2 may be the same or substantially similar, but the present disclosure is not limited thereto. FIGS. 7 and 8 illustrate that the shape of the first capping portion DM1 and the shape of the second capping portion DM2 are the same as one embodiment.

The first capping portion DM1 (e.g., an outer surface of the first capping portion DM1) may have an inclination orientation that changes (or varies) with respect to a first reference line DL1 parallel to the third direction DR3 (see, e.g., FIG. 8). For example, the first capping portion DM1 may have, with respect to the first reference line DL1 in FIG. 8, a first portion DM1a having an inclination that becomes gentler (e.g., shallower) toward one side of the first direction DR1 and a second portion DM1b having an inclination that becomes steeper toward one side of the first direction DR1.

The second portion DM1b of the first capping portion DM1 may be disposed on one side of the first portion DM1a in the first direction DR1. For example, the second portion DM1b of the first capping portion DM1 may be disposed to be more adjacent to (e.g., nearer to) the first end EDa of the light emitting element ED than the first portion DM1a is. For example, the first portion DM1a may not overlap the first end EDa of the light emitting element ED in the third direction DR3 but the second portion DM1b may at least partially overlap the first end EDa of the light emitting element ED in the third direction DR3.

The first reference line DL1 may not overlap the light emitting element ED in the third direction DR3. In other words, the first reference line DL1 may be spaced apart from the first end EDa of the light emitting element ED to the other side of the first direction DR1.

The second capping portion DM2 may have an inclination orientation that changes (or varies) respect to a second reference line DL2 parallel to the third direction DR3. For example, the second capping portion DM2 may have, with respect to the second reference line DL2 in FIG. 8, a first portion DM2a having an inclination that becomes steeper toward one side of the first direction DR1, and a second portion DM2b having an inclination that becomes gentler (e.g., shallower) toward one side of the first direction DR1.

The second portion DM2b of the second capping portion DM2 may be disposed on the other side of the first portion DM2a in the first direction DR1. For example, the second portion DM2b of the second capping portion DM2 may be disposed to be more adjacent to (e.g., nearer to) the second end EDb of the light emitting element ED than the first portion DM2a is. For example, the first portion DM2a may not overlap the second end EDb of the light emitting element ED in the third direction DR3, but the second portion DM2b may at least partially overlap the second end EDb of the light emitting element ED in the third direction DR3.

The second reference line DL2 may not overlap the light emitting element ED in the third direction DR3. In other words, the second reference line DL2 may be spaced apart from the second end EDb of the light emitting element ED to one side of the first direction DR1.

The capping portions DM1 and DM2 may include a transparent organic insulating material. For example, the capping portions DM1 and DM2 may include polyimide or the like. Accordingly, light emitted from both ends of the light emitting element ED may pass through the inside of the capping portions DM1 and DM2.

The capping portions DM1 and DM2 may improve the light output efficiency of the light emitting element ED together with the reflective layer RL, to be described later.

A third insulating layer PAS3 may be disposed on the second insulating layer PAS2 and on the capping portions DM1 and DM2. The third insulating layer PAS3 may be formed to have a substantially constant thickness along the profile (e.g., the outer surface) formed by the capping portions DM1 and DM2. The third insulating layer PAS3 may protect the capping portions DM1 and DM2 from the outside.

Each of the first insulating layer PAS1, the second insulating layer PAS2, and the third insulating layer PAS3, described above, may include an inorganic insulating material or an organic insulating material. In an embodiment, each of the first insulating layer PAS1, the second insulating layer PAS2, and the third insulating layer PAS3 may be any one of silicon oxide ($SiO_x$), silicon nitride ($SiN_x$), and silicon oxynitride ($SiO_xN_y$). The first insulating layer PAS1, the second insulating layer PAS2, and the third insulating layer PAS3 may be made of the same material or different materials. In other embodiments, some of these layers may be made of the same material and some of them may be made of different materials.

The reflective layer RL may be disposed on the third insulating layer PAS3. The reflective layer RL may reflect light emitted from the light emitting element ED toward one side of the third direction DR3.

The reflective layer RL may include a metal having high reflectivity. In some embodiments, the reflective layer RL may include at least one of silver (Ag), magnesium (Mg), aluminum (Al), platinum (Pt), nickel (Ni), lithium (Li), titanium (Ti), or molybdenum (Mo), but it is not limited thereto.

Similar to the third insulating layer PAS3, the reflective layer RL may be formed to have a substantially constant thickness along the profile (e.g., the outer surface) formed by the capping portions DM1 and DM2. Because the reflective layer RL is formed along the profile formed by the capping portions DM1 and DM2, the reflective layer RL may have substantially the same shape as the surface of the capping portions DM1 and DM2. Accordingly, the light output efficiency of the display device 1 may be improved.

For example, light emitted from the light emitting element ED is focused at both ends of the light emitting element ED, and because the light emitted from the light emitting element ED is not reflected back toward the light emitting element ED due to the shapes of the reflective layer RL and the capping portions DM1 and DM2 respectively formed at both ends of the light emitting element ED, the light output efficiency may be improved.

For example, referring to FIG. 8, first light L1 emitted from the first end EDa of the light emitting element ED toward the other side of the first direction DR1 (e.g., forward of the first end Eda) may be reflected by the first portion DM1a of the first capping portion DM1 to exit through the first substrate SUB1, the color conversion element layer QDL, and the second substrate SUB2. In addition, second light L2 emitted from the first end EDa of the light emitting element ED toward one side of the first direction DR1 (e.g., backward of the first end Eda) may be reflected sequentially by the second portion DM1b and then the first portion DM1a of the first capping portion DM1 to exit through the first substrate SUB1, the color conversion element layer QDL, and the second substrate SUB2.

Similarly, third light L3 emitted from the second end EDb of the light emitting element ED toward one side of the first direction DR1 (e.g., forward of the second end EDb) may be reflected by the first portion DM2a of the second capping portion DM2 to exit through the first substrate SUB1, the color conversion element layer QDL, and the second substrate SUB2, and fourth light L4 emitted from the second end EDb of the light emitting element ED toward the other side of the first direction DR1 (e.g., backward of the second end EDb) may be reflected sequentially by the second portion DM2b and then the first portion DM2a of the second capping portion DM2 to exit through the first substrate SUB1, the color conversion element layer QDL, and the second substrate SUB2.

Hereinafter, a structure having improved light output efficiency will be described in more detail with reference to FIG. 9.

Figure 9:
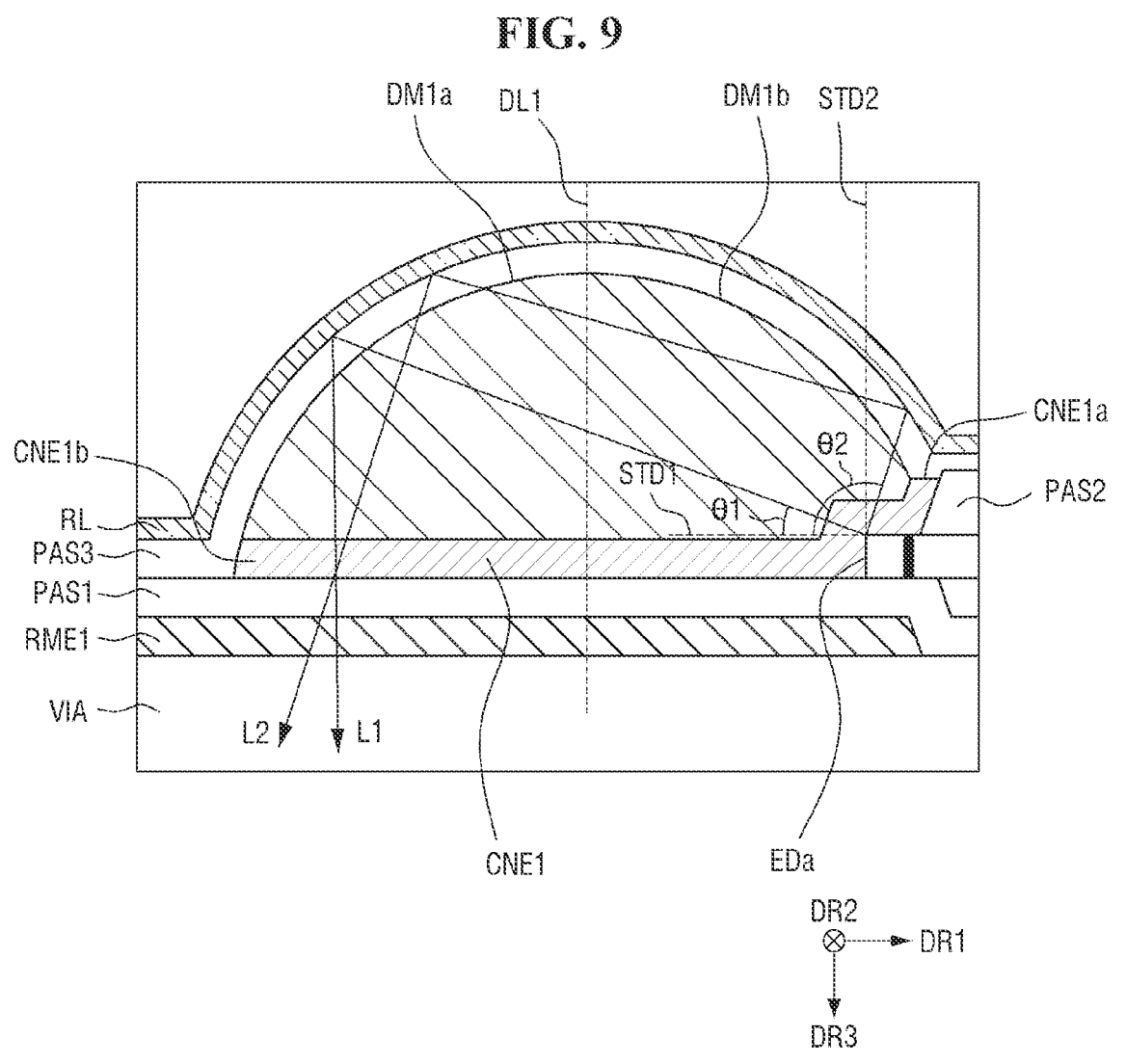

FIG. 9 is an enlarged view illustrating a light output structure of a display device according to one embodiment.

FIG. 9 illustrates an enlarged structure of the first end EDa of the light emitting element ED, and the first connection electrode CNE1, the first capping portion DM1, and the reflective layer RL disposed thereon. Because the structure of the second end EDb of the light emitting element ED, and the second connection electrode CNE2, the second capping portion DM2, and the reflective layer RL disposed thereon is substantially the same as the structure of the first end EDa of the light emitting element ED, and the first connection electrode CNE1, the first capping portion DM1, and the reflective layer RL disposed thereon, hereinafter, the structure of the first end EDa of the light emitting element ED, and the first connection electrode CNE1, the first capping portion DM1, and the reflective layer RL disposed thereon will be primarily described and a detailed description of the structure of the second end EDb of the light emitting element ED, and the second connection electrode CNE2, the second capping portion DM2, and the reflective layer RL disposed thereon will be omitted.

Referring to FIG. 9, light generated from the light emitting element ED may be emitted through the first end EDa. In FIG. 9, light emitted from the light emitting element ED is illustrated as being divided with respect to a first emission reference line STD1 parallel to the extension direction of the light emitting element ED (e.g., the first direction DR1) and a second emission reference line STD2 parallel to the plane direction of the first end EDa of the light emitting element ED (e.g., the third direction DR3).

For example, light emitted at a first angle $\theta 1$, that is an acute angle with respect to the first emission reference line STD1, may be classified as the first light L1, and light emitted at a second angle $\theta 2$, that is an obtuse angle with respect to the first emission reference line STD1, may be classified as the second light L2. In addition, light emitted to the other side of the first direction DR1 with respect to the second emission reference line STD2 may be classified as the first light L1, and light emitted to one side of the first direction DR1 with respect to the second emission reference line STD2 may be classified as the second light L2.

A portion of the reflective layer RL disposed on the first portion DM1a of the first capping portion DM1 may have a shape that blocks the path of light directed to the other side of the first direction DR1 and reflects the light directed to the other side of the first direction DR1 toward one side of the third direction DR3. The reflection direction of the light is provided by the first portion DM1a, which has a shape in which its inclination becomes gentler toward one side of the first direction DR1, and because a portion of the reflective layer RL disposed thereon follows the shape of the first portion DM1a.

A portion of the reflective layer RL disposed on the second portion DM1b of the first capping portion DM1 may have a shape that blocks the path of light directed to one side of the first direction DR1 and reflects the light directed to one side of the first direction DR1 toward the other side of the first direction DR1. The reflection direction of the light is provided by the second portion DM1b, which has a shape in which its inclination becomes steeper toward one side of the first direction DR1, and a portion of the reflective layer RL disposed thereon follows the shape of the second portion DM1b.

The first light L1 may be substantially reflected by the first portion DM1a of the first capping portion DM1 to exit to one side of the third direction DR3. However, the present disclosure is not limited thereto, and depending on the size of the first angle $\theta 1$, the first light L1 may be reflected by the second portion DM1b and the first portion DM1a to exit to one side of the third direction DR3.

The second light L2 may be substantially reflected by the second portion DM1b of the first capping portion DM1 to travel toward the other side of the first direction DR1 and may then be reflected by the first portion DM1a to exit to one side of the third direction DR3.

According to the configuration described above, not only the light emitted forward (e.g., to the other side of the first direction DR1) from the first end EDa of the light emitting element ED but also the light emitted backward (e.g., to one side of the first direction DR1) from the first end EDa may exit the display device (e.g., may exit downwardly through the first and second substrates SUB1 and SUB2) so that the light output efficiency of the display device 1 may be improved.

The first connection electrode CNE1 may have a first exposed surface CNE1a and a second exposed surface CNE1b exposed by the first capping portion DM1. The first exposed surface CNE1a may be disposed adjacent to the pattern portion of the second insulating layer PAS2 to be exposed to the other side of the third direction DR3, and the second exposed surface CNE1b may be disposed at the other end of the first connection electrode CNE1 in the first direction DR1 to be exposed to the other side of the first direction DR1.

The first exposed surface CNE1a and the second exposed surface CNE1b of the first connection electrode CNE1 may be in direct contact with the third insulating layer PAS3. In some embodiments, the first connection electrode CNE1 is formed using the first capping portion DM1 as an etch stop layer, which provides the above-described configuration.

Hereinafter, a process of manufacturing the display device 1 according to one embodiment will be described.

FIGS. 10 to 16 are diagrams illustrating steps of process of manufacturing a display device according to one embodiment.

FIGS. 10 to 16 illustrate cross sections for steps of a process of forming element layers on the other surface of the first substrate SUB1 in the third direction DR3. The process of forming the color conversion element layer QDL (see, e.g., FIG. 8) and the second substrate SUB2 (see, e.g., FIG. 8) disposed on one surface of the first substrate SUB1 in the third direction DR3 may be performed after the process of forming element layers on the other surface of the first substrate SUB1 in the third direction DR3, but the present disclosure is not limited thereto. In FIGS. 10 to 16, the color conversion element layer QDL and the second substrate SUB2 are omitted for simplicity of description.

Figure 10:
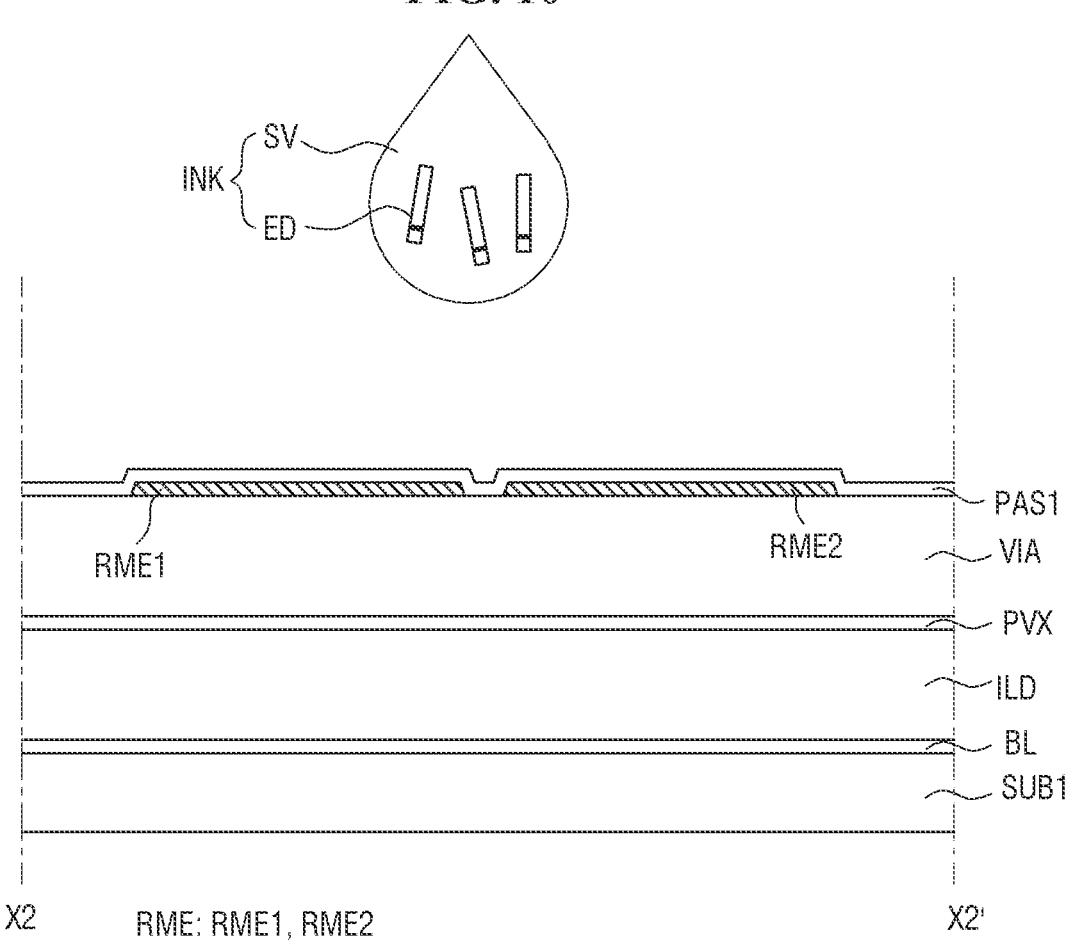
FIGS. 10 to 16 are diagrams illustrating steps of a process of manufacturing a display device according to one embodiment.
Figure 10:
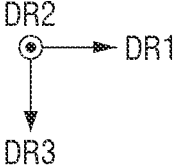
Figure 11:
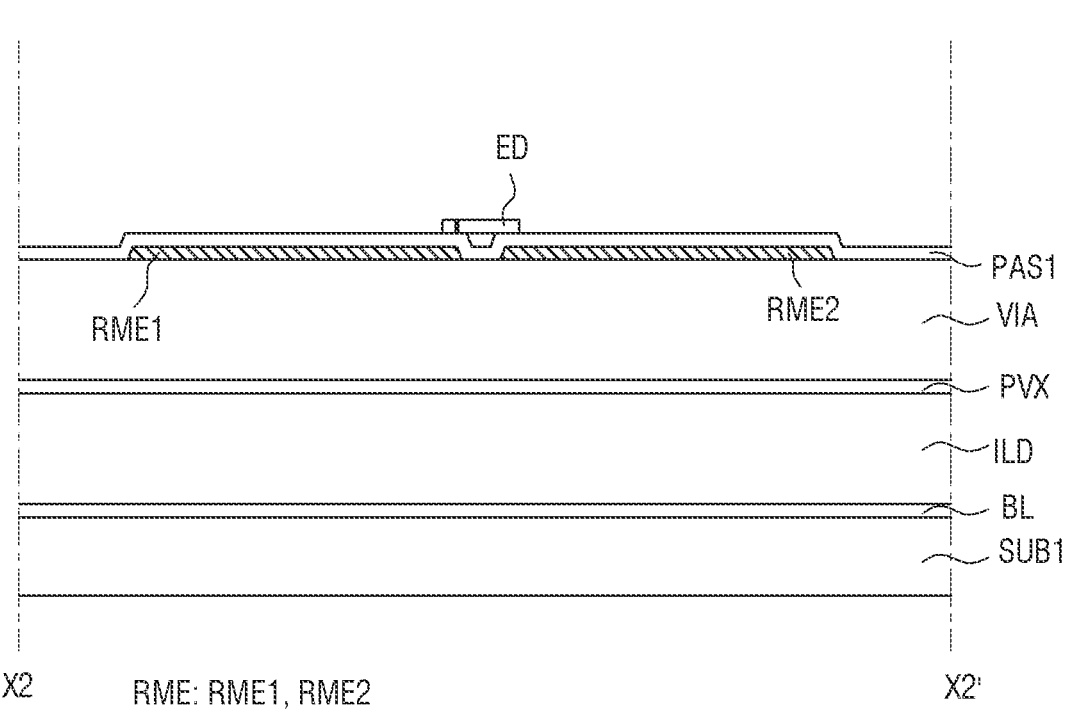
Figure 11:
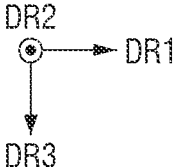

First, referring to FIGS. 10 and 11 in conjunction with FIG. 8, an ink INK including a solvent SV in which the light emitting elements ED are dispersed is discharged (or deposited) into the separation space between the first alignment electrode RME1 and the second alignment electrode RME2, and the light emitting elements ED are aligned.

The process of discharging the ink INK may be performed by using, for example, an ink-jet printing device. In such an embodiment, the ink INK may be discharged into the emission area EMA defined by the external bank BNL but may not be discharged to the remaining area.

The process of aligning the light emitting elements ED may be performed by using (or applying), for example, a dielectrophoresis (DEP) force generated by an electric field caused by alignment signals having different potential values.

The alignment signal may include a first alignment signal having a potential value substantially equal to that of the above-described first power voltage and a second alignment signal having a potential value substantially equal to that of the above-described second power voltage.

The electric field may be generated by applying alignment signals having different potential values to the first alignment electrode RME1 and the second alignment electrode RME2, respectively. For example, when a first alignment signal is applied to the first alignment electrode RME1 and a second alignment signal is applied to the second alignment electrode RME2, the light emitting element ED may be aligned such that the first end EDa (see, e.g., FIG. 8) is disposed above the first alignment electrode RME1 and the second end EDb (see, e.g., FIG. 8) is disposed above the second alignment electrode RME2 due to the electric field formed by (or formed between) the first alignment signal and the second alignment signal.

Figure 12:
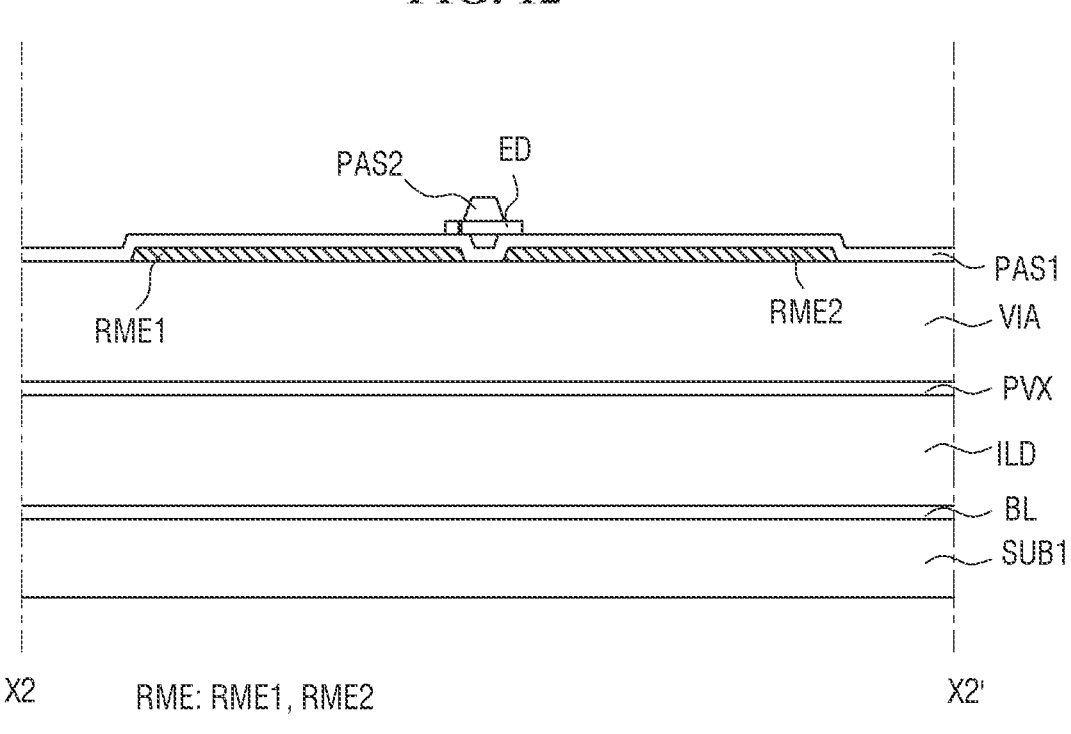
Figure 12:
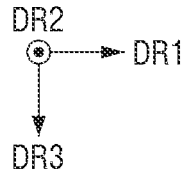

Next, referring to FIG. 12, the pattern portion of the second insulating layer PAS2 that exposes both ends of the light emitting element ED is formed on the light emitting element ED. A process of forming the pattern portion of the second insulating layer PAS2, according to an embodiment, is as follows.

First, a material for the second insulating layer may be entirely formed in the display area and may then be etched except for a portion corresponding to the pattern portion. The process of etching the material for the second insulating layer may be performed by dry etching but is not limited thereto.

Figure 13:
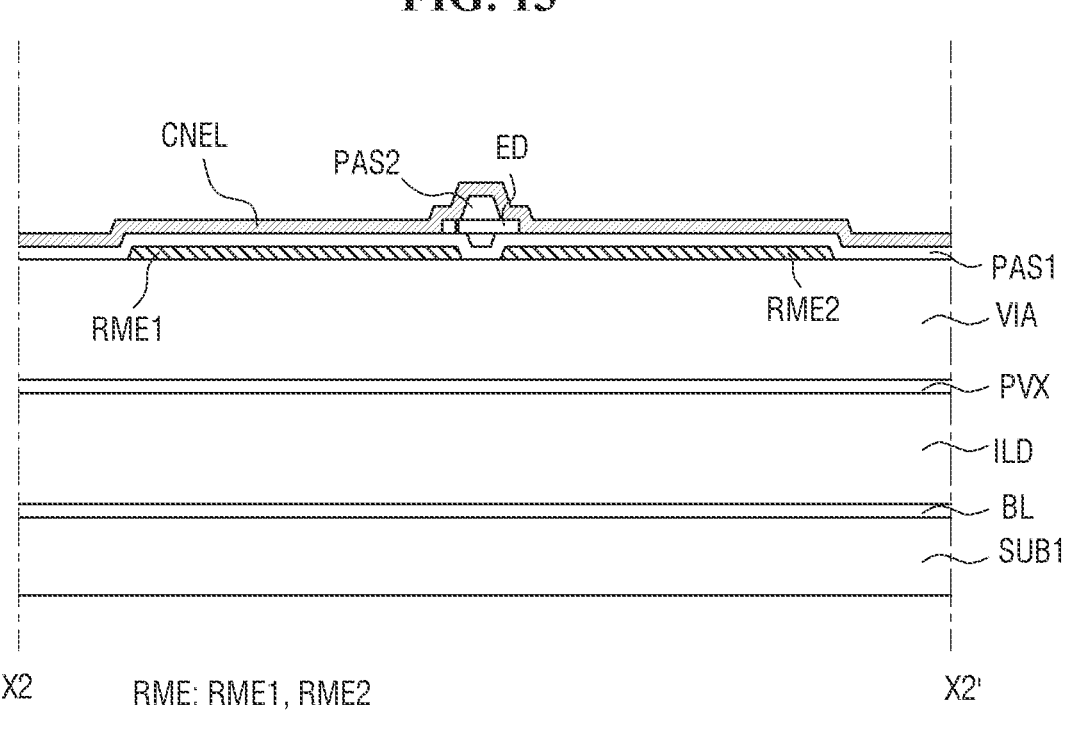

Then, referring to FIG. 13, a connection electrode layer CNEL is formed on the light emitting element ED and the pattern portion of the second insulating layer PAS2. The connection electrode layer CNEL may be formed entirely in the display area to cover all of the first insulating layer PAS1, the light emitting element ED, and the second insulating layer PAS2.

Figure 14:
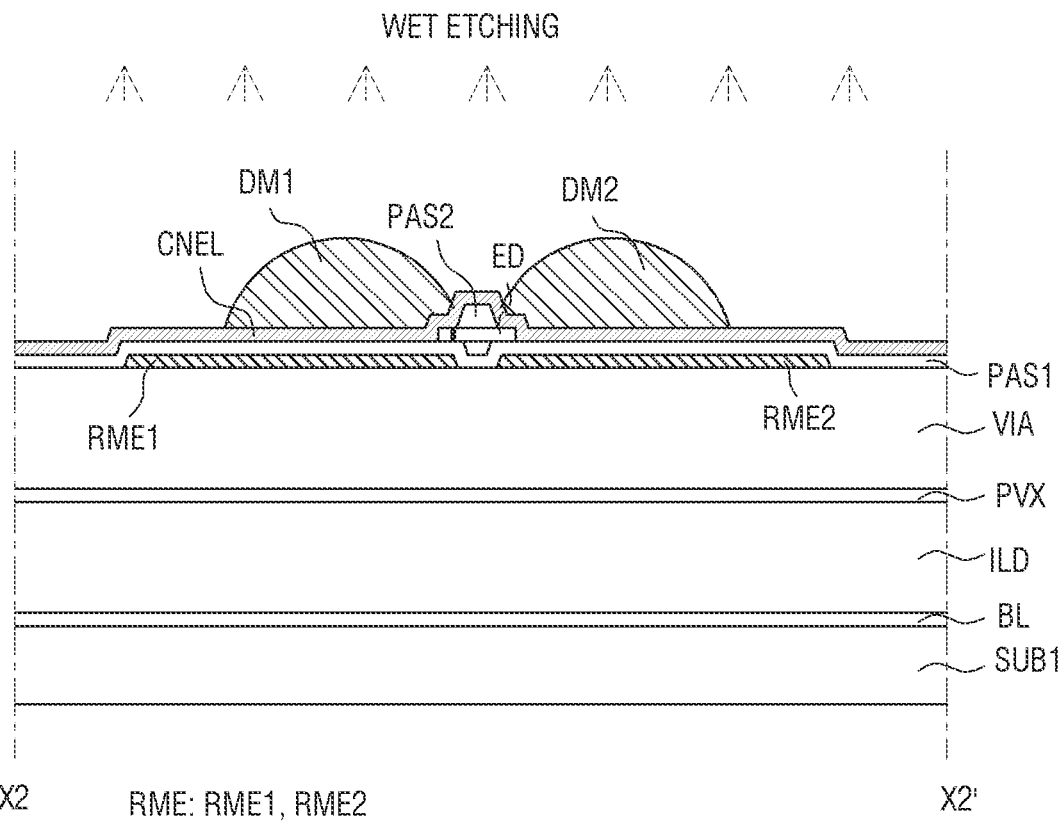
Figure 14:
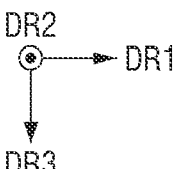
Figure 15:
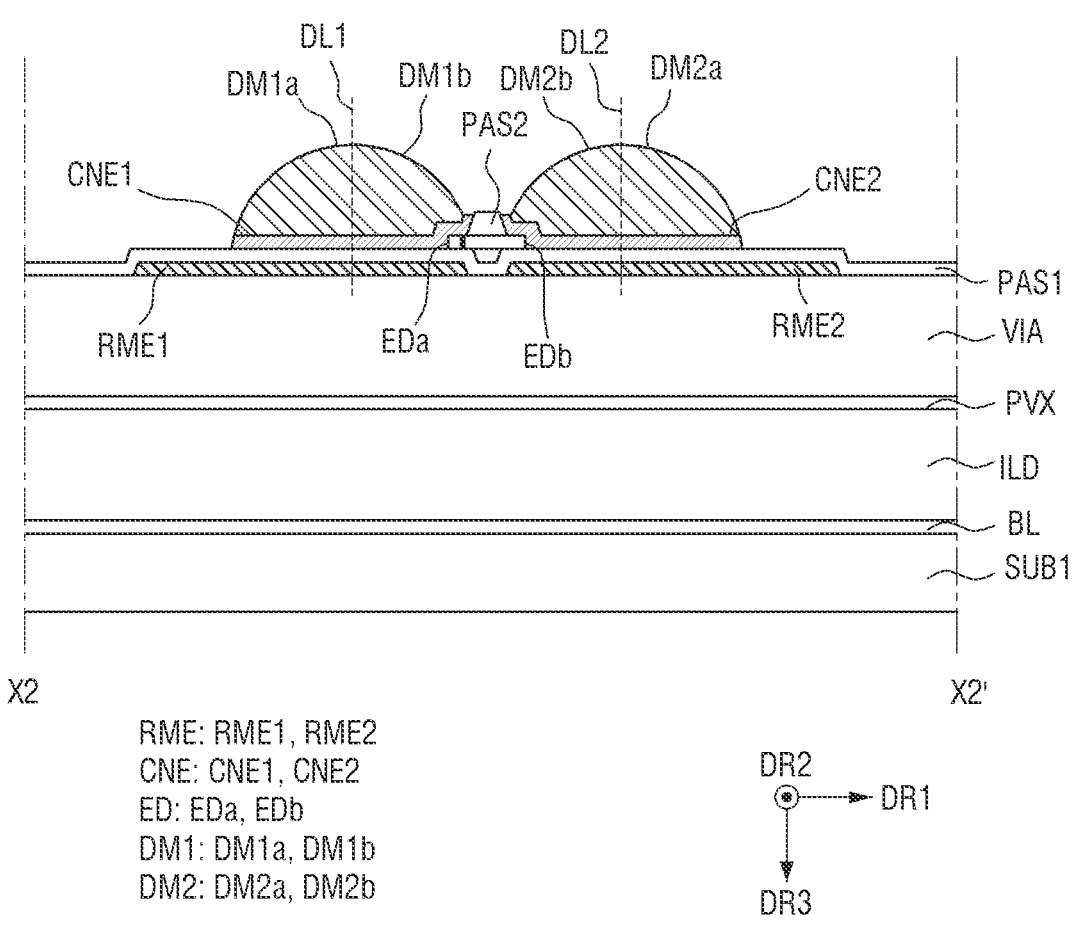

Next, referring to FIGS. 14 and 15, the first capping portion DM1 and the second capping portion DM2 are formed on the connection electrode layer CNEL, and the connection electrode layer CNEL is etched by using the first capping portion DM1 and the second capping portion DM2 as an etch stop layer. Accordingly, a portion of the connection electrode layer CNEL exposed by the first capping portion DM1 and the second capping portion DM2 may be etched to form the first connection electrode CNE1 and the second connection electrode CNE2.

The first capping portion DM1 and the second capping portion DM2 may be formed by forming an organic layer including a photosensitive organic material and then exposing and developing the organic layer. In such an embodiment, potassium hydroxide (KOH) may be used as a developing solution, for example. When the organic layer is developed by using a developing solution, as shown in FIGS. 14 and 15, the first capping portion DM1 and the second capping portion DM2 having a semi-elliptical shape or a dome shape similar thereto may be formed. Because the shapes of the first capping portion DM1 and the second capping portion DM2 are as described above, a detailed description thereof will be omitted.

The process of etching a portion of the connection electrode layer CNEL exposed by the first capping portion DM1 and the second capping portion DM2 may be performed by wet etching. Accordingly, the first capping portion DM1 and the second capping portion DM2, acting as the etch stop layer, may not be damaged or may be only barely damaged.

Figure 16:
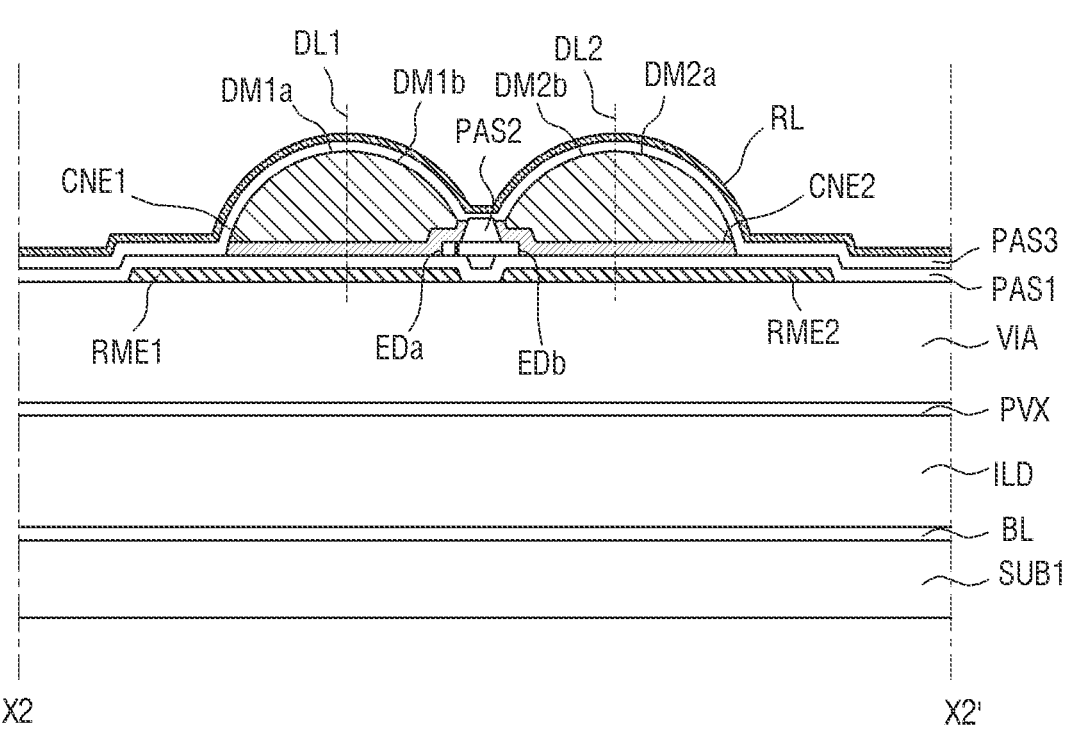
Figure 16:
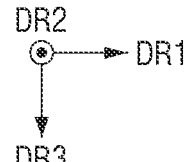

Next, referring to FIG. 16, the third insulating layer PAS3 and the reflective layer RL are sequentially formed on the first capping portion DM1 and the second capping portion DM2.

Thereafter, the color conversion element layer QDL and the second substrate SUB2 may be formed on one surface of the first substrate SUB1 in the third direction DR3, thereby manufacturing the display device 1 according to one embodiment.

Hereinafter, other embodiments of the display device 1 will be described. In the following embodiments, description of the same components as those in the above-described embodiment, which are denoted by like reference numerals, will be omitted or simplified, while differences between these embodiments will be primarily described.

Figure 17:
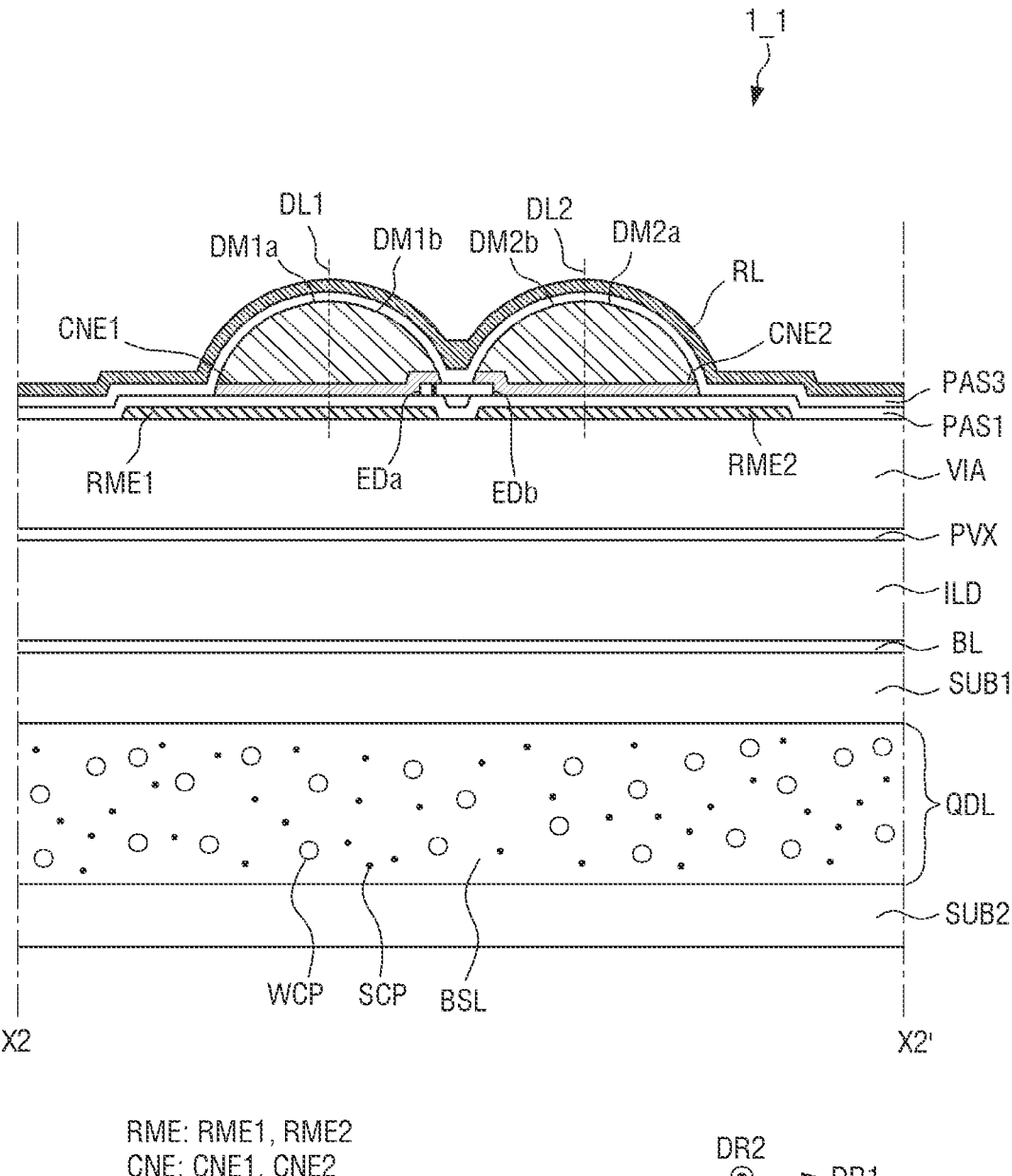
FIG. 17 is a cross-sectional view illustrating a schematic structure of a display device according to another embodiment.

FIG. 17 is a cross-sectional view illustrating a schematic structure of a display device according to another embodiment.

Referring to FIG. 17, a display device 1_1, according to the present embodiment, is different from the display device 1, according to above-described embodiment, in that the pattern portion of the second insulating layer PAS2 is omitted. Other configurations are substantially the same or similar.

For example, a portion of the light emitting element ED that is not in contact with the first connection electrode CNE1 or the second connection electrode CNE2 may be in direct contact with the third insulating layer PAS3.

Compared to the process of manufacturing the display device 1 according to one embodiment, in the process of manufacturing the display device 1_1 according to the present embodiment having the above configuration, the process of forming the pattern portion of the second insulating layer PAS2 is omitted such that the process of manufacturing the display device 1_1 may be simplified.

Figure 18:
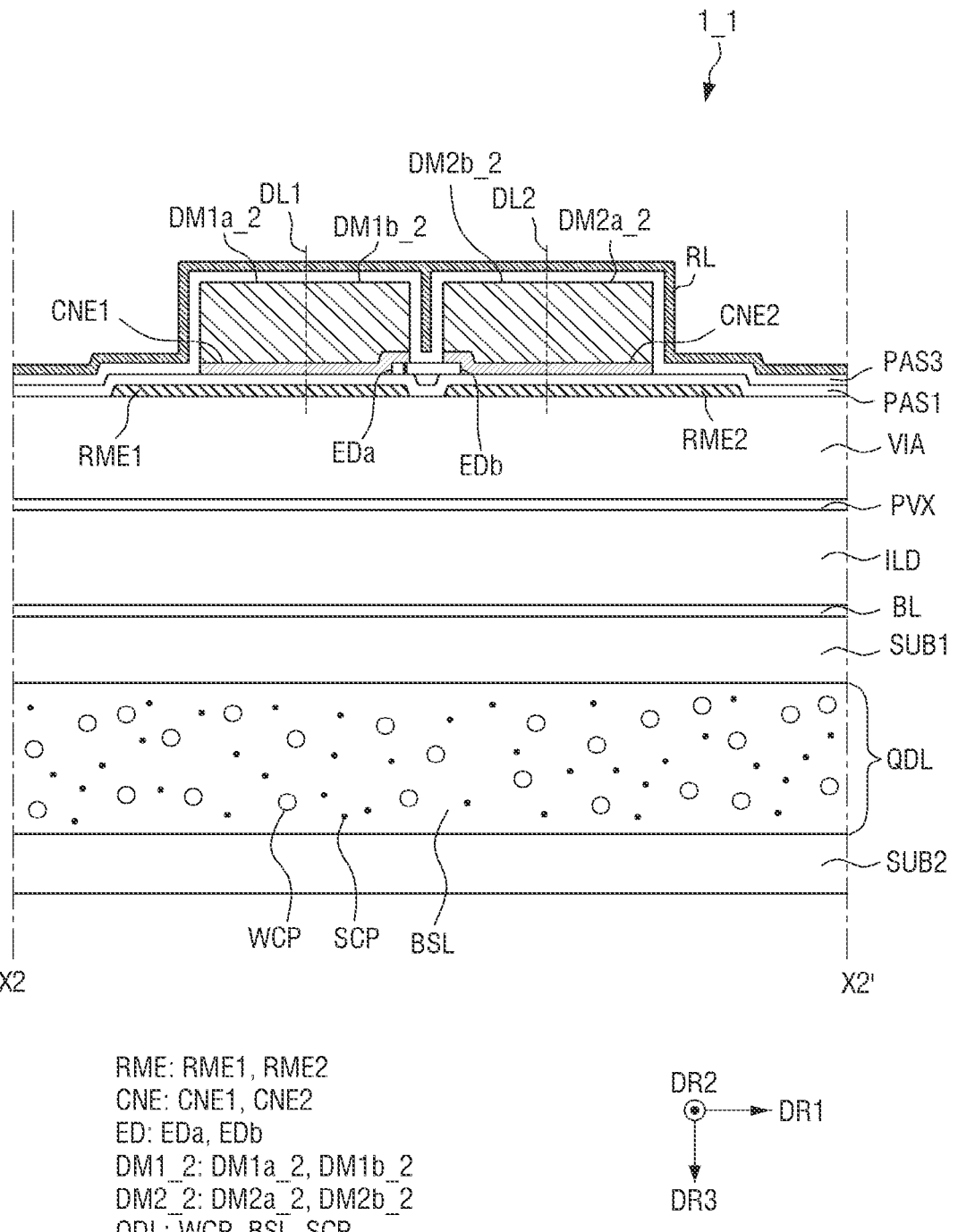
FIG. 18 is a cross-sectional view illustrating a schematic structure of a display device according to another embodiment.

FIG. 18 is a cross-sectional view illustrating a schematic structure of a display device according to another embodiment.

Referring to FIG. 18, in a display device 1_2, according to the present embodiment, a closed space formed by a first capping portion DM1_2 and a second capping portion DM2_2 has a polygonal shape. The polygonal shape of the first capping portion DM1_2 and a second capping portion DM2_2 may be formed because the process of forming the first capping portion DM1_2 and the second capping portion DM2_2 of the display device 1_2 is performed by dry etching.

For example, the display device 1_2, according to the present embodiment, is different from the display device 1_1 shown in FIG. 17 in that the shapes of the first capping portion DM1_2 and the second capping portion DM2_2 may be angular. Other configurations are substantially the same or similar. In some embodiments, the first capping portion DM1_2 and the second capping portion DM2_2 may have a rectangular cross section in a plan view but are not limited thereto. FIG. 18 illustrates an embodiment in which the first capping portion DM1_2 and the second capping portion DM2_2 have a rectangular cross section in a plan view.

Similar to the shape of the first capping portion DM1 and the second capping portion DM2 of the display device 1, according to one embodiment, the shape of the first capping portion DM1_2 and the second capping portion DM2_2 may form a closed space that blocks (and reflects) the path of light emitted from the light emitting element ED.

For example, a first portion DM1a_2 of the first capping portion DM1_2 may have a shape that is bent to one side of the first direction DR1 to block the path of light directed to the other side of the first direction DR1, and a second portion DM1b_2 thereof may have a shape that is bent to the other side of the first direction DR1 to block the path of light directed to the other side of the first direction DR1.

Accordingly, a portion of the reflective layer RL disposed on the first portion DM1a_2 of the first capping portion DM1_2 may have a shape that blocks the path of light directed to the other side of the first direction DR1, thereby reflecting the light directed to the other side of the first direction DR1 toward one side of the third direction DR3. In addition, a portion of the reflective layer RL disposed on the second portion DM1b_2 of the first capping portion DM1_2 may have a shape that blocks the path of light directed to one side of the first direction DR1, thereby reflecting the light directed to one side of the first direction DR1 toward the other side of the first direction DR1.

Similarly, a first portion DM2a_2 of the second capping portion DM2_2 may have a shape that is bent to the other side of the first direction DR1 to block the path of light directed to one side of the first direction DR1, and a second portion DM2b_2 thereof may have a shape that is bent to one side of the first direction DR1 to block the path of light directed to the other side of the first direction DR1.

Accordingly, a portion of the reflective layer RL disposed on the first portion DM2a_2 of the second capping portion DM2_2 may have a shape that blocks the path of light directed to one side of the first direction DR1, thereby reflecting the light directed to one side of the first direction DR1 toward one side of the third direction DR3. In addition, a portion of the reflective layer RL disposed on the second portion DM2b_2 of the second capping portion DM2_2 may have a shape that blocks the path of light directed to the other side of the first direction DR1, thereby reflecting the light directed to the other side of the first direction DR1 toward one side of the first direction DR1.

Figure 19:
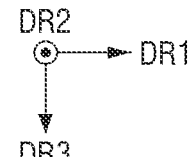
FIG. 19 is a cross-sectional view illustrating a schematic structure of a display device according to another embodiment.

FIG. 19 is a cross-sectional view illustrating a schematic structure of a display device according to another embodiment.

Referring to FIG. 19, in a display device 1_3, according to the present embodiment, the sizes of closed spaces formed by a first capping portion DM1_3 and the second capping portion DM2 may be different from each other. For example, the display device 1_3, according to the present embodiment, is different from the display device 1, according to one embodiment, in that the size of the first capping portion DM1_3 is different from the size of the second capping portion DM2. Other configurations are substantially the same or similar.

In the display device 1_3, according to the present embodiment, the volume of the first capping portion DM1_3 may be larger than that of the second capping portion DM2. For example, a thickness h1 (e.g., a maximum thickness) of the first capping portion DM1_3 at a point where the first reference line DL1 is positioned may be greater than a thickness h2 (e.g., a maximum thickness) of the second capping portion DM2 at a point where the second reference line DL2 is positioned.

The first capping portion DM1_3 may be disposed above the first end EDa of the light emitting element ED. The first end EDa may be closer to the light emitting layer 36 (see, e.g., FIG. 5) of the light emitting element ED than the second end EDb. Because light emitted from the light emitting element ED is generated in the light emitting layer 36, the amount of light emitted from the first end EDa closer to the light emitting layer 36 may be greater than the amount of light emitted from the second end EDb.

Accordingly, the light output efficiency of the display device 1_3 may be improved by forming the volume of the first capping portion DM1_3 disposed above the first end EDa to be larger than the volume of the second capping portion DM2 disposed above the second end EDb.

In concluding the detailed description, those skilled in the art will appreciate that many variations and modifications can be made to the embodiments described herein without substantially departing from the present disclosure. Therefore, the disclosed embodiments of the present disclosure are used and are to be understood in a generic and descriptive sense and not for purposes of limitation.

What is claimed is:

1. A display device comprising:
a first substrate;
a thin film transistor on the first substrate;
a via insulation layer on the thin film transistor;
a light emitting element on the via insulating layer and having first and second ends with different polarities from each other;
a first capping portion on the first end of the light emitting element and forming a first closed space;
a second capping portion spaced apart from the first capping portion, on the second end of the light emitting element, and forming a second closed space; and
a reflective layer covering the first capping portion and the second capping portion,
wherein the light emitting element, the first capping portion, and the second capping portion do not overlap the thin film transistor in a thickness direction.

2. The display device of claim 1, further comprising an anchor portion between the light emitting element and the reflective layer and exposing the first and second ends of the light emitting element,
wherein the anchor portion is between the first capping portion and the second capping portion.

3. The display device of claim 2, further comprising a first insulating layer covering the first capping portion, the second capping portion, and the anchor portion,
wherein the reflective layer is on the first insulating layer.

4. The display device of claim 3, further comprising:
a first connection electrode in contact with the first end of the light emitting element and electrically connected to the thin film transistor; and
a second connection electrode in contact with the second end of the light emitting element and spaced apart from the first connection electrode,
wherein the first capping portion is on the first connection electrode, and
wherein the second capping portion is on the second connection electrode.

5. The display device of claim 4, wherein at least a portion of the first connection electrode is exposed in a separation space between the first capping portion and the anchor portion and is in contact with the first insulating layer, and
wherein at least a portion of the second connection electrode is exposed in a separation space between the second capping portion and the anchor portion and is in contact with the first insulating layer.

6. The display device of claim 1, further comprising a first insulating layer covering the first capping portion and the second capping portion,
wherein the first insulating layer is in contact with a portion of the light emitting element exposed by a separation space between the first capping portion and the second capping portion, and
wherein the reflective layer is on the first insulating layer.

7. The display device of claim 1, wherein each of the first capping portion and the second capping portion has a semi-elliptical shape or a dome shape, and
wherein the reflective layer is curved along outer surfaces of the first capping portion and the second capping portion.

8. The display device of claim 7, wherein the first capping portion has a varying inclination orientation with respect to a first reference line,
wherein the second capping portion has a varying inclination orientation with respect to a second reference line,
wherein the first reference line is outside the first end of the light emitting element, and
wherein the second reference line is outside the second end of the light emitting element.

9. The display device of claim 8, wherein the first capping portion comprises:
a first portion on one side of the first reference line and having a decreasing inclination in a direction toward the light emitting element; and
a second portion on another side of the first reference line and having an increasing inclination in a direction toward the light emitting element,
wherein the second capping portion comprises:
a first portion on one side of the second reference line and having a decreasing inclination in a direction toward the light emitting element; and
a second portion on another side of the second reference line and having an increasing inclination in a direction toward the light emitting element,
wherein the second portion of the first capping portion is closer to the light emitting element than the first portion of the first capping portion is, and
wherein the second portion of the second capping portion is closer to the light emitting element than the first portion of the second capping portion is.

10. The display device of claim 9, wherein the light emitting element comprises:
a first semiconductor layer;
an active layer on the first semiconductor layer; and
a second semiconductor layer on the active layer,
wherein the active layer is closer to the first end of the light emitting element than the second end of the light emitting element, and
wherein a volume of the first capping portion is greater than a volume of the second capping portion.

11. A display device comprising:
a first substrate;
a via insulation layer on a top surface of the first substrate;
a light emitting element on the via insulating layer and having first and second ends with different polarities from each other;
a first capping portion on the first end of the light emitting element and forming a first closed space;
a second capping portion spaced apart from the first capping portion, on the second end of the light emitting element, and forming a second closed space;
a reflective layer covering the first capping portion and the second capping portion; and
a color conversion element layer on a bottom surface of the first substrate.

12. The display device of claim 11, wherein light emitted from the light emitting element is reflected by the reflective layer and passes through the color conversion element layer.

13. The display device of claim 12, wherein the color conversion element layer comprises:
a base member;
a scatterer in the base member; and/or
a wavelength conversion material in the base member.

14. The display device of claim 13, wherein each of the first capping portion and the second capping portion has a semi-elliptical shape or a dome shape, and wherein the reflective layer is curved along outer surfaces of the first capping portion and the second capping portion.

15. The display device of claim 14, wherein the first capping portion has a varying inclination orientation with respect to a first reference line, wherein the second capping portion has a varying inclination orientation with respect to a second reference line, wherein the first reference line is outside the first end of the light emitting element, and wherein the second reference line is outside the second end of the light emitting element.

16. The display device of claim 15, wherein the first capping portion comprises:

a first portion on one side of the first reference line and having a decreasing inclination in a direction toward the light emitting element; and a second portion on the other side of the first reference line and having an increasing inclination in a direction toward the light emitting element, the second capping portion comprises:

a first portion on one side of the second reference line and having a decreasing inclination in a direction toward the light emitting element; and a second portion on the other side of the second reference line and having an increasing inclination in a direction toward the light emitting element, wherein the second portion of the first capping portion is closer to the light emitting element than the first portion of the first capping portion is, and wherein the second portion of the second capping portion is closer to the light emitting element than the first portion of the second capping portion is.

17. The display device of claim 13, further comprising an anchor portion between the light emitting element and the reflective layer and exposing the first and second ends of the light emitting element, wherein the anchor portion is between the first capping portion and the second capping portion.

18. The display device of claim 17, further comprising a first insulating layer covering the first capping portion, the second capping portion, and the anchor portion, wherein the reflective layer is on the first insulating layer.

19. A manufacturing method of a display device, the method comprising:

forming a first alignment electrode and a second alignment electrode spaced apart from each other on a first substrate;

arranging a light emitting element in a separation space between the first alignment electrode and the second alignment electrode, the light emitting element having first and second ends with different polarities from each other;

forming a connection electrode layer on the light emitting element;

forming, on the connection electrode layer, a first capping portion overlapping the first end of the light emitting element and having a first closed space and a second capping portion overlapping the second end of the light emitting element and having a second closed space;

forming a first connection electrode in contact with the first end of the light emitting element and a second connection electrode in contact with the second end of the light emitting element by etching the connection electrode layer exposed by the first capping portion and the second capping portion by using the first capping portion and the second capping portion as an etch stop layer; and forming a reflective layer on the first capping portion and the second capping portion.

20. The manufacturing method of claim 19, wherein each of the first capping portion and the second capping portion has a semi-elliptical shape or a dome shape, and wherein the reflective layer is curved along outer surfaces of the first capping portion and the second capping portion.

* * * * *